US009991272B2

(12) United States Patent
Hamada et al.

(10) Patent No.: US 9,991,272 B2
(45) Date of Patent: Jun. 5, 2018

(54) SEMICONDUCTOR MEMORY DEVICE

(71) Applicant: Toshiba Memory Corporation, Minato-ku (JP)

(72) Inventors: Tatsufumi Hamada, Yokkaichi (JP); Shinya Naito, Toyota (JP); Hiroshi Kanno, Yokkaichi (JP); Yoshiaki Fukuzumi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/460,761

(22) Filed: Mar. 16, 2017

(65) Prior Publication Data
US 2018/0076210 A1 Mar. 15, 2018

Related U.S. Application Data

(60) Provisional application No. 62/393,812, filed on Sep. 13, 2016.

(51) Int. Cl.
H01L 27/115 (2017.01)
H01L 27/11556 (2017.01)
H01L 27/11524 (2017.01)
H01L 27/1157 (2017.01)
H01L 27/11582 (2017.01)
H01L 29/10 (2006.01)
(Continued)

(52) U.S. Cl.
CPC .... H01L 27/11556 (2013.01); H01L 27/1157 (2013.01); H01L 27/11524 (2013.01); H01L 27/11582 (2013.01); H01L 29/1037 (2013.01); H01L 27/11519 (2013.01); H01L 27/11565 (2013.01); H01L 29/42368 (2013.01)

(58) Field of Classification Search
CPC .......... H01L 27/11556; H01L 29/1037; H01L 27/1157; H01L 27/11582; H01L 27/11524; H01L 27/11565; H01L 29/42368; H01L 27/11519
See application file for complete search history.

(56) References Cited

U.S. PATENT DOCUMENTS 9,613,975 B2 * 4/2017 Huang .............. H01L 27/11578
2010/0320528 A1 12/2010 Jeong et al.
(Continued)

Primary Examiner — David Vu
(74) Attorney, Agent, or Firm — Oblon, McClelland, Maier & Neustadt, L.L.P.

(57) ABSTRACT

According to one embodiment, a semiconductor memory device includes a base semiconductor layer, first and second conductive layers, a semiconductor body, a memory layer, first and second semiconductor regions, and an insulating portion. The first conductive layer is separated from the base semiconductor layer in a first direction. The second conductive layer is provided between the base semiconductor layer and the first conductive layer. The semiconductor body extends through the first conductive layer in the first direction. The memory layer is provided between the semiconductor body and the first conductive layer. The first semiconductor region is provided between the memory layer and the base semiconductor layer and between the semiconductor body and the base semiconductor layer, and is of a first conductivity type. The second semiconductor region is provided between the first semiconductor region and the memory layer, and is of a second conductivity type.

11 Claims, 25 Drawing Sheets

(51) Int. Cl.
*H01L 27/11519* (2017.01)
*H01L 27/11565* (2017.01)
*H01L 29/423* (2006.01)

(56) References Cited

U.S. PATENT DOCUMENTS

2013/0034945 A1   2/2013   Park
2013/0134492 A1   5/2013   Yang et al.
2014/0035026 A1   2/2014   Jang et al.
2014/0070302 A1   3/2014   Yoo et al.
2015/0262826 A1   9/2015   Yun et al.

\* cited by examiner

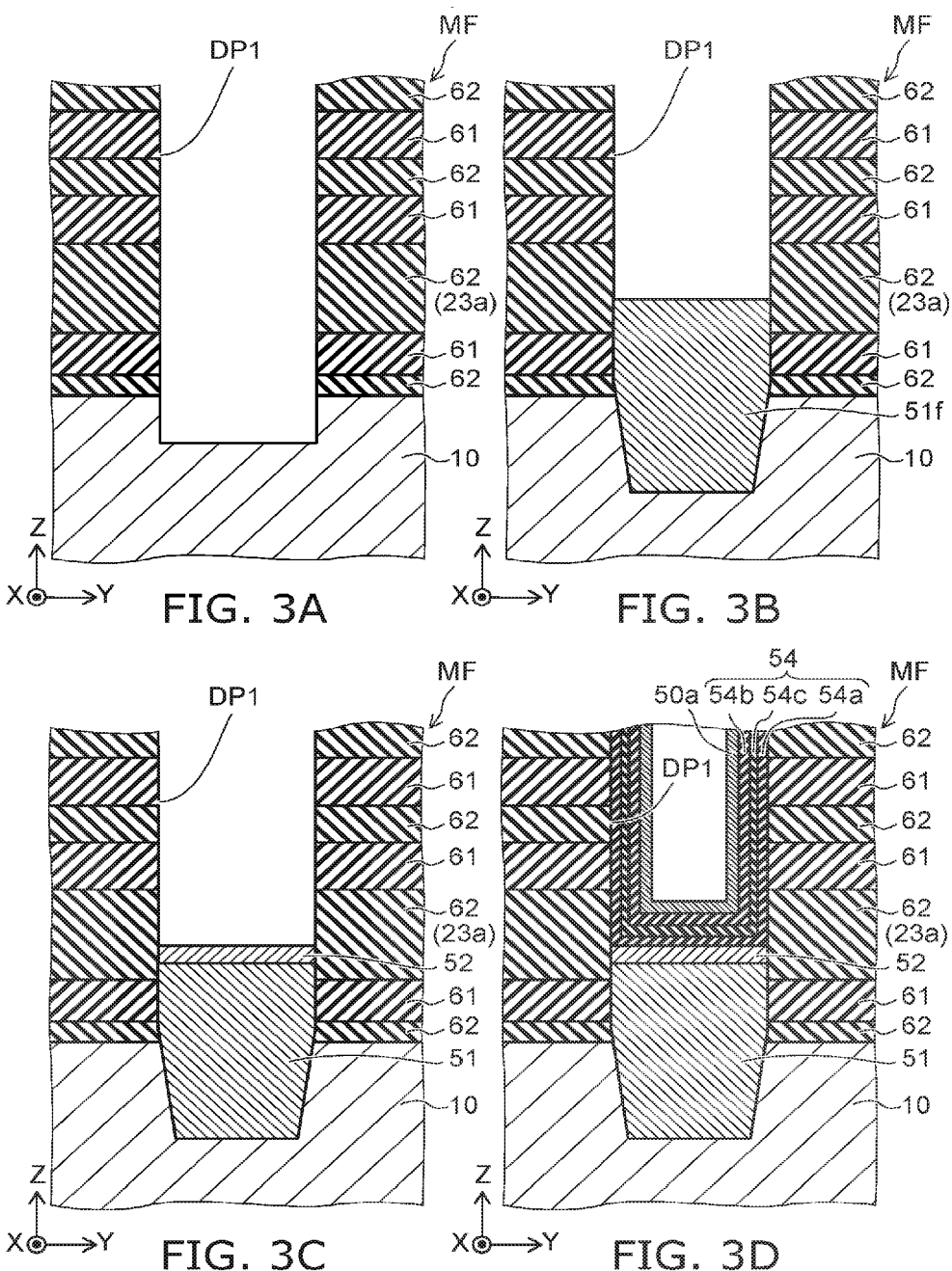

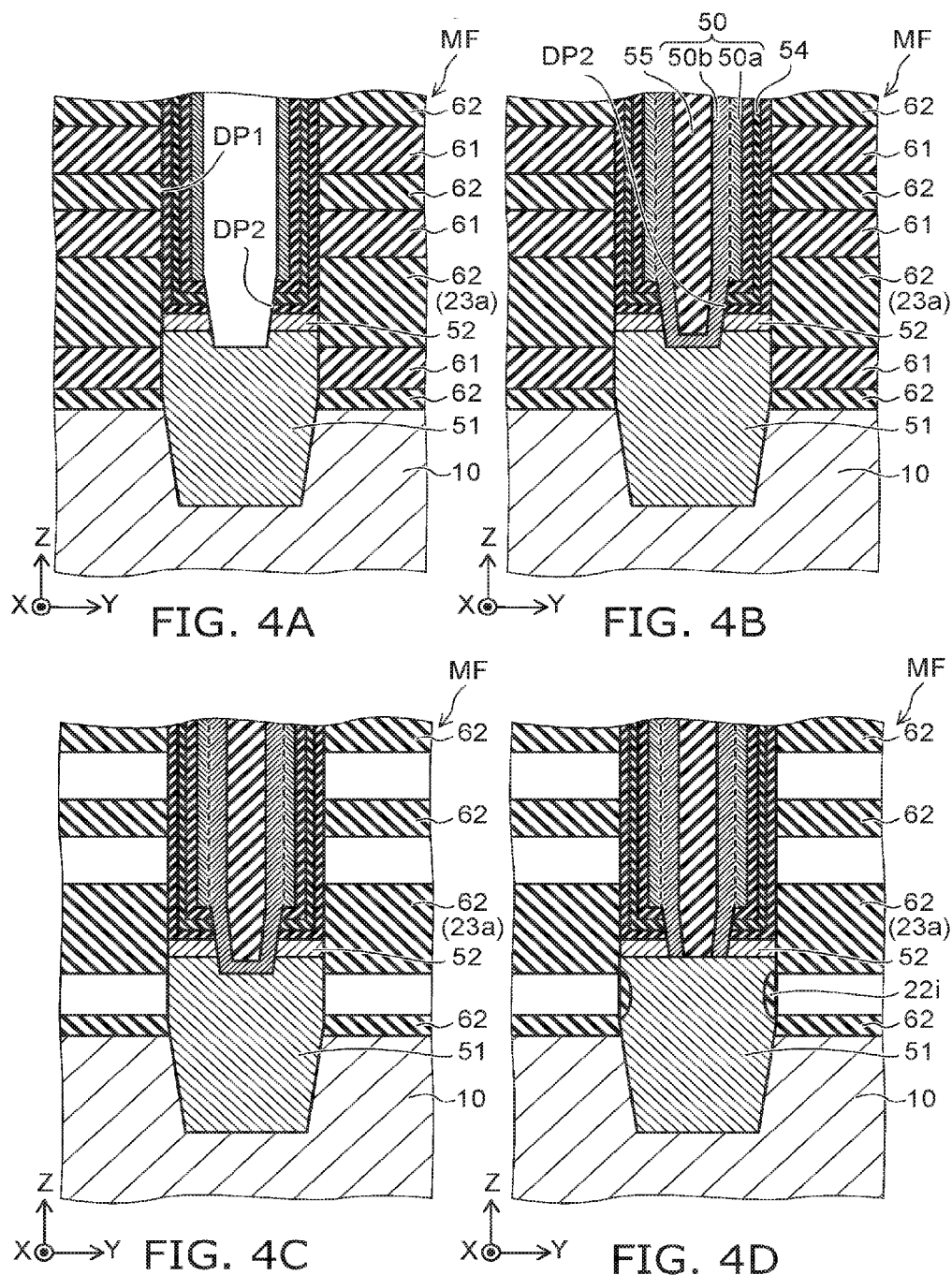

SEMICONDUCTOR MEMORY DEVICE

CROSS-REFERENCE TO RELATED APPLICATIONS

This application is based upon and claims the benefit of priority from U.S. Provisional Patent Application 62/393,812, filed on Sep. 13, 2016; the entire contents of which are incorporated herein by reference.

FIELD

Embodiments described later relate generally to a semiconductor memory device.

BACKGROUND

Stable operations are desirable in a semiconductor memory device.

BRIEF DESCRIPTION OF THE DRAWINGS

FIG. 3A to FIG. 3D are schematic cross-sectional views in order of the processes, illustrating a method for manufacturing the semiconductor memory device according to the first embodiment;

FIG. 4A to FIG. 4D are schematic cross-sectional views in order of the processes, illustrating a method for manufacturing the semiconductor memory device according to the first embodiment;

DETAILED DESCRIPTION

Figure 1A:
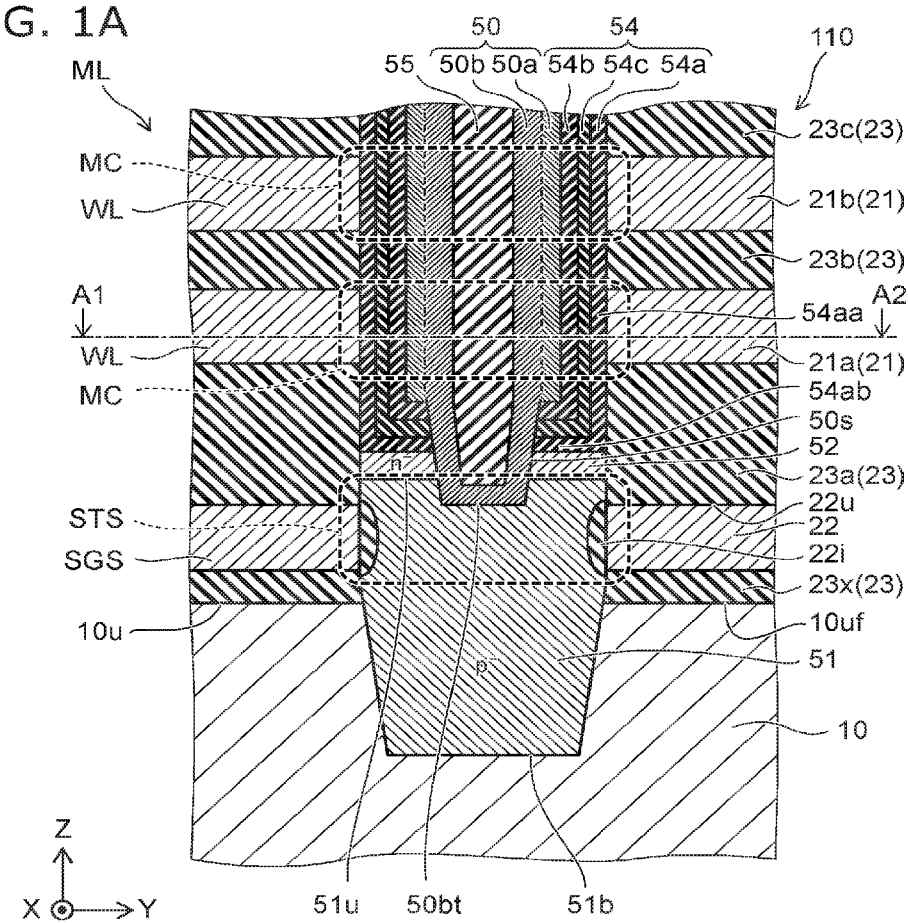
FIG. 1A and FIG. 1B are schematic cross-sectional views illustrating a semiconductor memory device according to a first embodiment.

According to one embodiment, a semiconductor memory device includes a base semiconductor layer, a first conductive layer, a second conductive layer, a semiconductor body, a memory layer, a first semiconductor region, a second semiconductor region, and an insulating portion. The first conductive layer is separated from the base semiconductor layer in a first direction. The second conductive layer is provided between the base semiconductor layer and the first conductive layer. The semiconductor body extends through the first conductive layer in the first direction. The memory layer is provided between the semiconductor body and the first conductive layer. The first semiconductor region is provided between the memory layer and the base semiconductor layer and between the semiconductor body and the base semiconductor layer, and is of a first conductivity type. The second semiconductor region is provided between the first semiconductor region and the memory layer, and is of a second conductivity type. The insulating portion is provided between the first semiconductor region and the second conductive layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
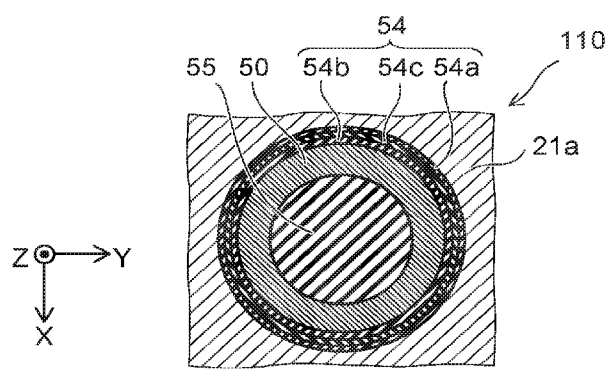

FIG. 1A and FIG. 1B are schematic cross-sectional views illustrating a semiconductor memory device according to a first embodiment.

FIG. 1B is a line A1-A2 cross-sectional view of FIG. 1A. These drawings illustrate a memory region of the semiconductor memory device.

As shown in FIG. 1A, the semiconductor memory device 110 according to the embodiment includes a base semiconductor layer 10, a first conductive layer 21a, a second conductive layer 22, a semiconductor body 50, a memory layer 54, a first semiconductor region 51, a second semiconductor region 52, and an insulating portion 22i.

The base semiconductor layer 10 is, for example, at least a portion of a semiconductor substrate. The semiconductor substrate is, for example, a silicon substrate. The base semiconductor layer 10 may be a semiconductor layer provided on a substrate.

The first conductive layer 21a is separated from the base semiconductor layer 10 in a direction.

The direction is taken as a Z-axis direction. One direction perpendicular to the Z-axis direction is taken as an X-axis direction. A direction perpendicular to the Z-axis direction and the X-axis direction is taken as a Y-axis direction. For example, the Z-axis direction is substantially perpendicular to an upper surface 10uf of the base semiconductor layer 10. For example, the base semiconductor layer 10 spreads along the X-Y plane.

For example, the first conductive layer 21a is one word line WL of the semiconductor memory device 110. Multiple word lines WL are provided in the example. The multiple word lines WL correspond respectively to multiple conductive layers 21. The multiple conductive layers 21 include, for example, the first conductive layer 21a, the conductive layer 21b, etc. Multiple insulating layers 23 (insulating layers 23a, 23b, 23c, etc.) are provided respectively at the positions between the multiple conductive layers 21. The multiple conductive layers 21 and the multiple insulating layers 23 are included in a stacked body ML. The first conductive layer 21a is any one of the multiple conductive layers 21.

The second conductive layer 22 is provided between the base semiconductor layer 10 and the first conductive layer 21a. An insulating layer 23x is provided between the second conductive layer 22 and the base semiconductor layer 10. The insulating layer 23x may be considered to be a portion of the multiple insulating layers 23.

The semiconductor body 50 extends through the first conductive layer 21a in the Z-axis direction. For example, the semiconductor body 50 extends through the stacked body ML along the Z-axis direction. For example, the semiconductor body 50 has a pillar configuration.

As shown in FIG. 1B, for example, the semiconductor body 50 has a tubular configuration. The semiconductor body 50 that has the tubular configuration extends in the Z-axis direction. A core insulating layer 55 is provided in the space on the inner side of the semiconductor body 50. The core insulating layer 55 may be omitted in the embodiment. The semiconductor body 50 may have a columnar configuration (the space may not be provided on the inner side).

In the example, the semiconductor body 50 includes a first semiconductor body film 50a and a second semiconductor body film 50b. The first semiconductor body film 50a is provided around the second semiconductor body film 50b. The boundaries between these semiconductor body films may be indistinct.

The memory layer 54 is provided between the semiconductor body 50 and the first conductive layer 21a. The memory layer 54 is provided between the semiconductor body 50 and each of the multiple conductive layers 21.

In the example, the memory layer 54 includes a memory film 54c, a first insulating film 54a, and a second insulating film 54b. The first insulating film 54a includes a portion 54aa provided between the memory film 54c and the first conductive layer 21a (the conductive layer 21). The second insulating film 54b is provided between the memory film 54c and the semiconductor body 50.

The memory film 54c is, for example, a charge storage layer. The memory film 54c includes, for example, silicon nitride, etc. The memory film 54c may be, for example, a floating electrode (a floating gate). In such a case, the memory film 54c includes, for example, polysilicon, etc.

The first insulating film 54a is, for example, a blocking insulating film. The second insulating film 54b is, for example, a tunneling insulating film. The first insulating film 54a and the second insulating film 54b include, for example, a silicon oxide film, etc.

Memory cells MC are formed at the portions where the semiconductor body 50 and each of the multiple conductive layers 21 cross. The memory cells MC are memory transistors. The multiple conductive layers 21 (the multiple word lines WL) are used as gate electrodes of the memory transistors.

The first semiconductor region 51 is provided between the memory layer 54 and the base semiconductor layer 10 and between the semiconductor body 50 and the base semiconductor layer 10. For example, a portion of the first semiconductor region 51 is provided between the memory layer 54 and the base semiconductor layer 10 in the Z-axis direction. A portion of the first semiconductor region 51 is provided between the semiconductor body 50 and the base semiconductor layer 10 in the Z-axis direction. The first semiconductor region 51 is of a first conductivity type. The first conductivity type is, for example, a p-type. The first semiconductor region 51 is, for example, a p⁻-region.

The second semiconductor region 52 is provided between the first semiconductor region 51 and the memory layer 54. The second semiconductor region 52 is of a second conductivity type. For example, the second semiconductor region 52 is of an n-type. The second semiconductor region 52 is, for example, an n⁻-region.

In the memory layer 54 in the example, the first insulating film 54a further includes a portion 54ab provided between the memory film 54c and the second semiconductor region 52. The memory film 54c is electrically insulated from the second semiconductor region 52 by the portion 54ab.

The semiconductor body 50 is electrically connected to the first semiconductor region 51 and the second semiconductor region 52. For example, the semiconductor body 50 is electrically connected to the base semiconductor layer 10 via the first semiconductor region 51. Further, the semiconductor body 50 is electrically connected to the base semiconductor layer 10 via the second semiconductor region 52.

In the specification, in the state in which a first conductor and a second conductor are electrically connected to each other, a state is formable in which a current flows between these conductors.

The insulating portion 22i is provided between the first semiconductor region 51 and the second conductive layer 22. A selection transistor (e.g., a source-side selection transistor STS) is formed at the portion where the second conductive layer 22 and the first semiconductor region 51 cross. The second conductive layer 22 is, for example, a source-side selection gate SGS. At least a portion of the first semiconductor region 51 is used as at least a portion of the channel of the source-side selection transistor STS. The insulating portion 22i is used as a gate insulating film of the source-side selection transistor STS. For example, the insulating portion 22i is continuous with the insulating layer 23a and the insulating layer 23x.

The multiple semiconductor bodies 50 are provided as described below. For example, each of the multiple semiconductor bodies 50 is electrically connected to one of multiple bit lines (not illustrated in FIG. 1A and FIG. 1B). For example, a drain-side selection transistor (not illustrated in FIG. 1A and FIG. 1B) is provided at the upper portion of the stacked body ML. On the other hand, the base semiconductor layer 10 is electrically connected to a source line (not illustrated in FIG. 1A and FIG. 1B). One of the multiple semiconductor bodies 50 is selectable by operations of the source-side selection transistor STS and the drain-side selection transistor. Charge (e.g., electrons, etc.) is injected into or removed from the memory film 54c of each of the multiple memory cells MC by controlling the potentials of the bit lines, the source line, and the word lines WL. The threshold voltage of the memory cell MC changes according to the state of the charge stored in the memory film 54c. The change of the threshold voltage is read. Thus, in the semiconductor memory device 110, the programming, erasing, and reading of information is performed.

In the semiconductor memory device 110, the first semiconductor region 51 is provided between the semiconductor body 50 and the base semiconductor layer 10; and the second semiconductor region 52 is further provided on the first semiconductor region 51. Thereby, for example, a current (e.g., $I_{cell}$) that flows through the semiconductor body 50 can be increased. An example of the operations of the semiconductor memory device 110 will now be described.

Figure 2A:
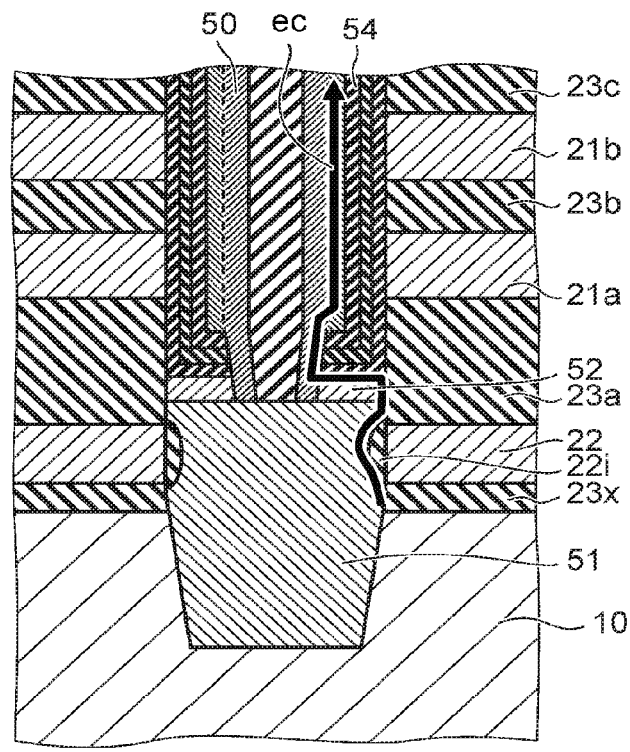
FIG. 2A and FIG. 2B are schematic cross-sectional views illustrating the operations of the semiconductor memory device according to the first embodiment.
Figure 2B:
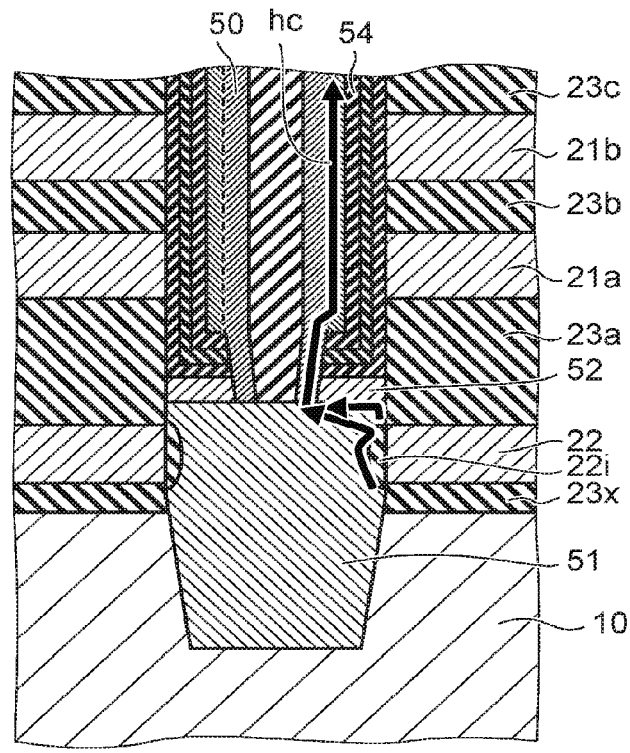

FIG. 2A and FIG. 2B are schematic cross-sectional views illustrating the operations of the semiconductor memory device according to the first embodiment.

FIG. 2A illustrates the state in which electrons ec flow from the base semiconductor layer 10 toward the semiconductor body 50. For example, this state occurs when the potential of the semiconductor body 50 is higher than the potential of the base semiconductor layer 10. FIG. 2B illustrates the state in which holes hc flow from the base semiconductor layer 10 toward the semiconductor body 50. For example, this state occurs when the potential of the semiconductor body 50 is lower than the potential of the base semiconductor layer 10.

As shown in FIG. 2A, the electrons ec are injected into the first semiconductor region 51 from the base semiconductor layer 10. For example, the electrons ec move along the interface between the first semiconductor region 51 and the insulating portion 22i. Further, the electrons ec move along the interface between the first semiconductor region 51 and the insulating layer 23a. Subsequently, the electrons ec move along the interface between the second semiconductor region and the first insulating film 54a. Subsequently, the electrons ec are injected into the semiconductor body 50 from the second semiconductor region 52 and further move through the semiconductor body 50.

Thus, in the embodiment, for example, a channel is formed of the second semiconductor region 52. Thereby, for example, the parasitic capacitance can be reduced.

A reference example may be considered in which the first semiconductor region 51 is provided but the second semiconductor region 52 is not provided. In the reference example, an impurity of the first conductivity type (e.g., boron, etc.) is introduced to the first semiconductor region 51. In other words, the first semiconductor region 51 is a $p^-$-semiconductor region. Thereby, the threshold voltage of the source-side selection transistor STS is adjusted; and, for example, there is a possibility that the control of the source-side selection transistor STS may be easier. However, in the reference example, the resistance may increase at the connection portion between the first semiconductor region 51 and the semiconductor body 50 because the second semiconductor region 52 is not provided. Thereby, the current that flows through the semiconductor body 50 (e.g., $I_{cell}$) may be undesirably low.

Conversely, in the embodiment, the second semiconductor region 52 of the second conductivity type (e.g., an $n^-$-semiconductor region) is provided in addition to the first semiconductor region 51 of the first conductivity type (e.g., the $p^-$-semiconductor region). Because the channel is formed of the second semiconductor region 52, the decrease of the current (e.g., $I_{cell}$) flowing through the semiconductor body 50 can be suppressed. For example, the operational performance such as the operation speed, etc., improve. For example, a stable read operation is obtained. According to the embodiment, stable operations are obtained.

On the other hand, as shown in FIG. 2B, the holes hc are injected into the first semiconductor region 51 from the base semiconductor layer 10. The holes hc move through the first semiconductor region 51 by, for example, diffusion. Further, for example, the holes hc move through the interface vicinity between the first semiconductor region 51 and the second semiconductor region 52. The holes hc are injected into the semiconductor body 50 from both the first semiconductor region 51 and the second semiconductor region 52 and further move through the semiconductor body 50.

In the embodiment, the thickness of the second semiconductor region 52 is, for example, not less than 5 nanometers (nm) and not more than 10 nm.

As shown in FIG. 1A, the second conductive layer 22 is provided on the base semiconductor layer 10; and the first conductive layer 21a is provided on the second conductive layer 22. In such a case, a lower end portion 50bt of the semiconductor body 50 is positioned lower than an upper end portion 51u of the first semiconductor region 51. At least a portion of the lower end portion 50bt of the semiconductor body 50 is buried in the first semiconductor region 51. Thereby, for example, the first semiconductor region 51 and the semiconductor body 50 are electrically connected to each other more stably.

On the other hand, at least a portion of the second semiconductor region 52 is positioned higher than an upper end portion 22u of the second conductive layer 22. For example, in the X-Y plane, the second conductive layer 22 overlaps (opposes) the first semiconductor region 51; but in the X-Y plane, the second conductive layer 22 does not overlap (does not oppose) the second semiconductor region 52. By setting the second conductive layer 22 to oppose the first semiconductor region 51 (e.g., the $p^-$-semiconductor region) in the X-Y plane, for example, the cut-off of the source-side selection transistor STS is easier.

A lower end portion 51b of the first semiconductor region 51 is positioned lower than an upper end portion 10u of the base semiconductor layer 10. For example, as described below, the recess is formed by digging out a portion of the base semiconductor layer 10; and the first semiconductor region 51 is formed in the recess. For example, in the X-Y plane, at least a portion of the side surface of the first semiconductor region 51 contacts the base semiconductor layer 10. For example, an electrically stable connection is obtained at the first semiconductor region 51 and the base semiconductor layer 10.

An example of the method for manufacturing the semiconductor memory device 110 will now be described.

FIG. 3A to FIG. 3D and FIG. 4A to FIG. 4D are schematic cross-sectional views in order of the processes, illustrating the method for manufacturing the semiconductor memory device according to the first embodiment.

As shown in FIG. 3A, a stacked film MF is formed on the base semiconductor layer 10 (e.g., a silicon substrate) by alternately stacking first films 61 and second films 62; further, a first recess DP1 (which may be, for example, a hole) is formed in the stacked film MF. The first films 61 are, for example, silicon nitride films; and the second films 62 are, for example, silicon oxide films. For example, the second films 62 are used to form the insulating layers 23x and 23. As described below, the conductive layers 21 and the second conductive layer 22 are formed by removing the first films 61 and introducing a conductive material to the space where the first films 61 are removed. The first films 61 are, for example, sacrificial layers. For example, the first films 61 and the second films 62 can be formed by CVD (Chemical Vapor Deposition), etc. For example, the first recess DP1 can be formed by RIE (Reactive Ion Etching), etc., using a mask (not illustrated). The bottom portion of the first recess DP1 reaches the base semiconductor layer 10. A portion of the base semiconductor layer 10 is removed at the bottom portion of the first recess DP1.

As shown in FIG. 3B, a semiconductor film 51f is epitaxially grown at the bottom portion of the first recess DP1. For example, a semiconductor that is doped with an impurity of the first conductivity type (e.g., boron, etc.) is grown from the bottom portion of the first recess DP1. For example, in the X-Y plane, the position in the height direction (the position in the Z-axis direction) of the semiconductor film 51f overlaps the second film 62 used to form the insulating layer 23a.

As shown in FIG. 3C, ion implantation of an impurity of the second conductivity type (e.g., at least one of arsenic, phosphorus, or the like) into the upper portion of the semiconductor film 51f at the bottom portion of the first recess DP1 is performed. The portion where the impurity is implanted is used to form the second semiconductor region 52. For example, the portion where the impurity substantially is not implanted is used to form the first semiconductor region 51. Or, the portion where the concentration of the impurity of the first conductivity type is higher than the concentration of the impurity of the second conductivity type is used to form the first semiconductor region 51. In the second semiconductor region 52, for example, the impurity of the first conductivity type and the impurity of the second conductivity type exist. For example, in the second semiconductor region 52, the concentration of the impurity of the second conductivity type is higher than the concentration of the impurity of the first conductivity type.

In the example recited above, a combination of epitaxial growth of the semiconductor film containing the impurity of the first conductivity type and the subsequent ion implantation of the impurity of the second conductivity type is implemented. In the embodiment, a combination of epitaxial growth of the first semiconductor film containing the impurity of the first conductivity type and subsequent epitaxial growth of the second semiconductor film containing the impurity of the second conductivity type may be implemented.

As shown in FIG. 3D, the memory layer 54 (the first insulating film 54a, the memory film 54c, and the second insulating film 54b) and the first semiconductor body film 50a are formed on the bottom surface and the side surface of the first recess DP1. For example, these films can be formed by CVD.

As shown in FIG. 4A, a second recess DP2 (which may be, for example, a hole) is formed in the memory layer 54 and the first semiconductor body film 50a at the bottom portion of the first recess DP1. The second recess DP2 pierces the memory layer 54, the first semiconductor body film 50a, and the second semiconductor region 52 and reaches the first semiconductor region 51. A portion of the first semiconductor region 51 is exposed at the bottom portion of the second recess DP2. For example, the second recess DP2 can be formed by RIE.

As shown in FIG. 4B, the second semiconductor body film 50b is formed on the bottom surface and the side surface of the second recess DP2. For example, the second semiconductor body film 50b can be formed by CVD, etc. A portion of the second semiconductor body film 50b contacts the first semiconductor body film 50a. The first semiconductor body film 50a and the second semiconductor body film 50b become the semiconductor body 50. The semiconductor body 50 physically contacts the first semiconductor region 51 at the bottom surface and at a portion of the side surface of the second recess DP2. At the side surface of the second recess DP2, the semiconductor body 50 physically contacts the second semiconductor region 52. In the example, the core insulating layer 55 is formed by filling an insulating material into the remaining space of the second recess DP2.

The first films 61 are removed as shown in FIG. 4C. This is performed by, for example, forming a not-illustrated hole (a slit, etc.) in the stacked film MF and by etching the first films 61 (e.g., the silicon nitride films) via the hole. In the memory layer 54, the memory film 54c (e.g., the silicon nitride film) is protected by the first insulating film 54a (e.g., the silicon oxide film) and is not removed in the etching. A portion (a side surface portion) of the first semiconductor region 51 is exposed by the removal of the first films 61.

As shown in FIG. 4D, for example, the insulating portion 22i is formed at the exposed portion of the first semiconductor region 51. For example, the insulating portion 22i may be formed by thermal oxidation of the exposed portion of the first semiconductor region 51. Further, at least a portion of the insulating portion 22i may be formed by forming an aluminum oxide film, etc. The aluminum oxide film may be formed also on the upper surface and the lower surface of the second films 62. The insulating layers 23x and 23 may be formed of such an aluminum oxide film and such second films 62.

Subsequently, the conductive layers 21 (the first conductive layer 21a, the conductive layer 21b, etc.) and the second conductive layer 22 can be formed by introducing a conductive material into the space between the multiple second films 62 (the space formed by removing the first films 61).

The conductive material may include, for example, tungsten, etc. The conductive material may include a semiconductor (e.g., polysilicon) including an impurity.

Thereby, the semiconductor memory device 110 can be formed.

Figure 5:
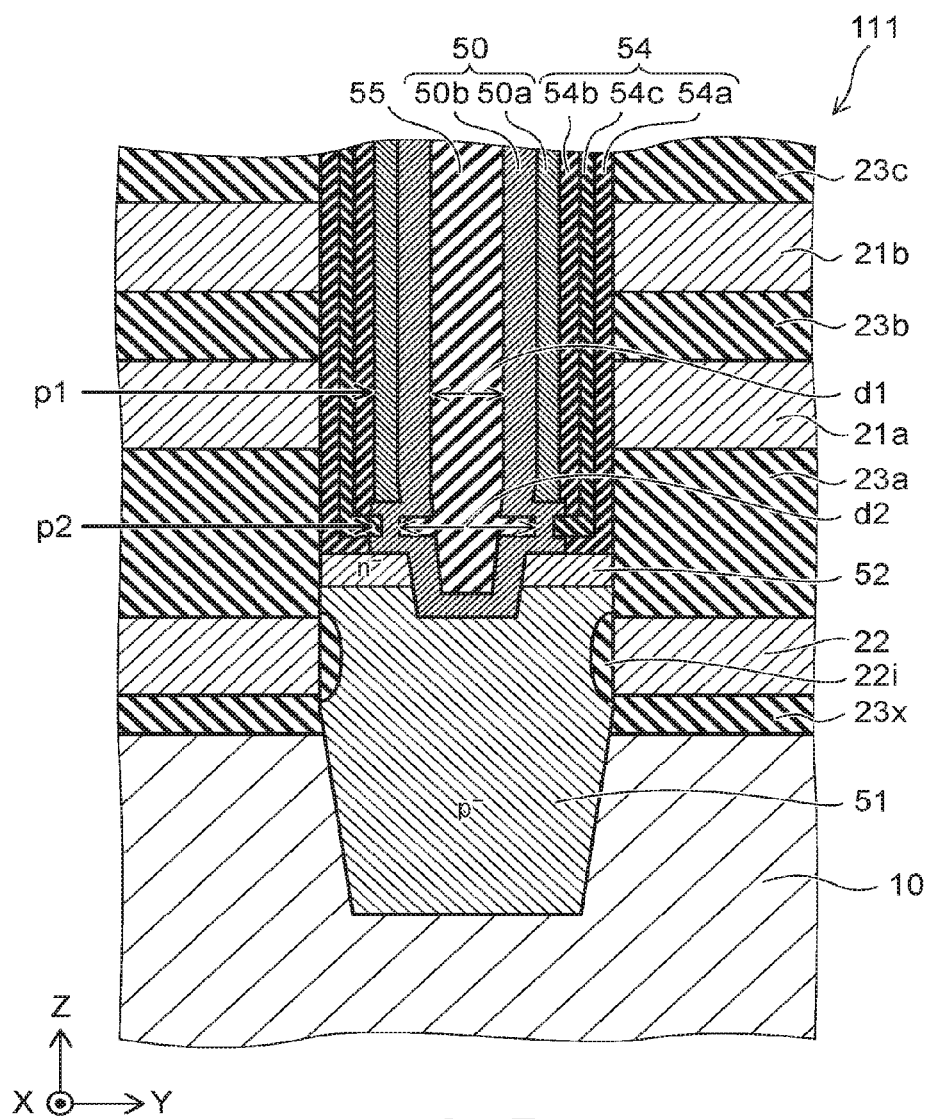
FIG. 5 is a schematic cross-sectional view illustrating another semiconductor memory device according to the first embodiment.

FIG. 5 is a schematic cross-sectional view illustrating another semiconductor memory device according to the first embodiment.

As shown in FIG. 5, the other semiconductor memory device 111 according to the embodiment also includes the base semiconductor layer 10, the first conductive layer 21a, the second conductive layer 22, the semiconductor body 50, the memory layer 54, the first semiconductor region 51, the second semiconductor region 52, and the insulating portion 22i. In the semiconductor memory device 111, the semiconductor body 50 has a tubular configuration; and the inner diameter of a portion of the semiconductor body 50 is different from the inner diameter of the other portions. Otherwise, the semiconductor memory device 111 is similar to the semiconductor memory device 110; and a description is therefore omitted.

In the semiconductor memory device 111, the semiconductor body 50 includes a first portion p1 and a second portion p2. The first portion p1 overlaps the first conductive layer 21a in a direction (one direction in the X-Y plane) crossing the Z-axis direction. The second portion p2 overlaps a region (e.g., the insulating layer 23a) between the first conductive layer 21a and the second conductive layer 22 in a direction (one direction in the X-Y plane) crossing the Z-axis direction. In the semiconductor memory device 111, an inner diameter d2 of the second portion p2 is larger than an inner diameter d1 of the first portion p1. In other words, a portion (the second portion p2) is provided where the inner diameter of the semiconductor body 50 is larger than the inner diameter of the portion (the first portion p1) at the memory cells MC.

The first semiconductor region 51 and the second semiconductor region 52 are provided in the semiconductor memory device 111 as well. Thereby, the decrease of the current (e.g., $I_{cell}$) can be suppressed; and stable operations are obtained.

Figure 6:
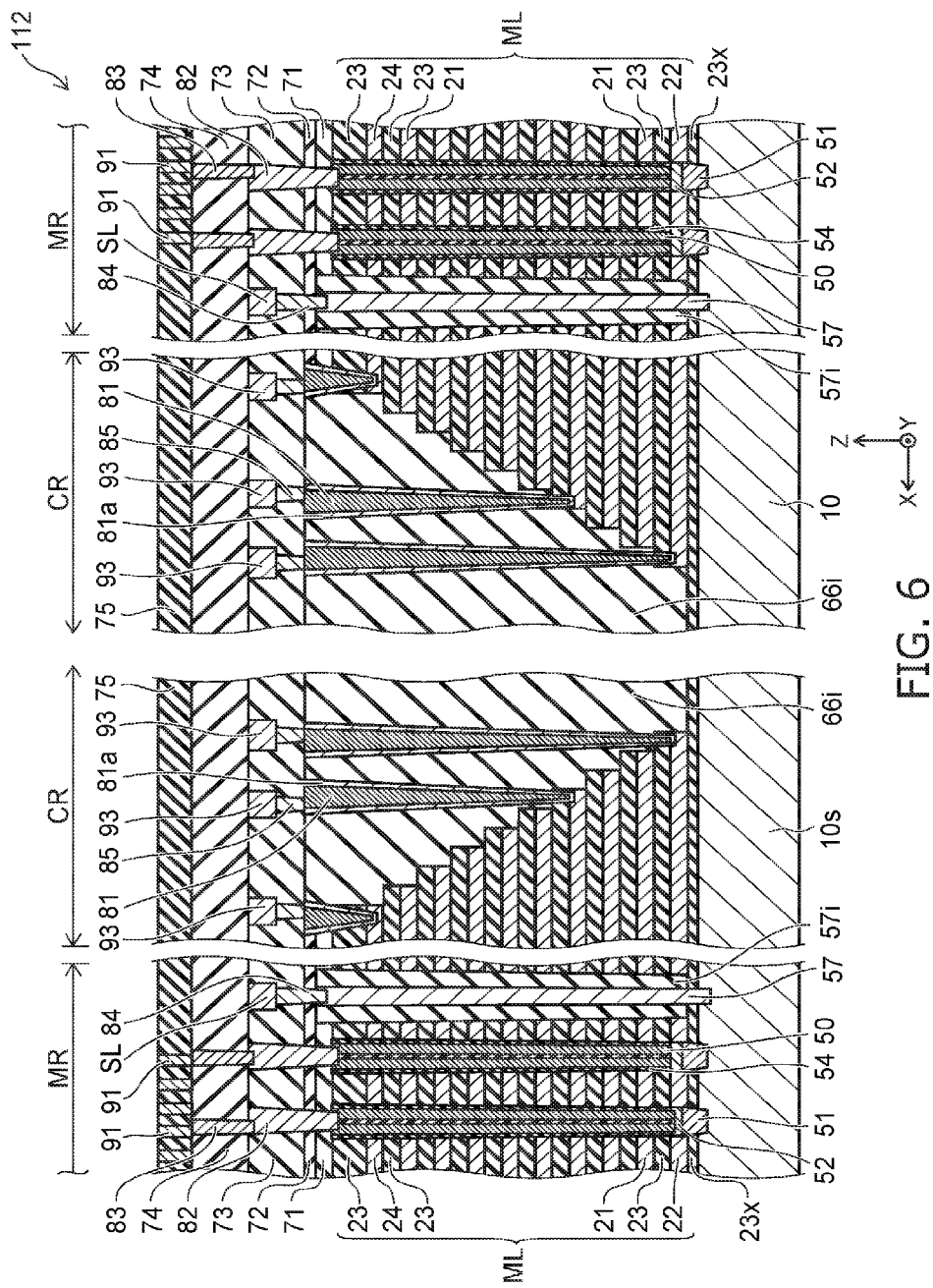
FIG. 6 is a schematic cross-sectional view illustrating another semiconductor memory device according to the first embodiment.

FIG. 6 is a schematic cross-sectional view illustrating another semiconductor memory device according to the first embodiment.

FIG. 6 also illustrates a connection region CR in addition to a memory region MR of the semiconductor memory device according to the embodiment.

As shown in FIG. 6, the base semiconductor layer 10 (e.g., the semiconductor substrate) is provided in the semiconductor memory device 112 according to the embodiment. In the example, the insulating layer 23x is provided on the base semiconductor layer 10.

In the memory region MR, the stacked body ML is provided on the insulating layer 23x. Also, the semiconductor body 50, the memory layer 54, and a conductive portion 57 are provided. The conductive portion 57 is used as a source member. The second conductive layer 22 is provided at the lower portion of the stacked body ML; and a conductive layer 24 is provided at the upper portion. The multiple conductive layers 21 are provided between the second conductive layer 22 and the conductive layer 24. The insulating layers 23 are provided between these conductive layers. The second conductive layer 22 is used as the source-side selection gate SGS (e.g., the lower selection gate). The conductive layer 24 is used as a drain-side selection gate SGD (e.g., an upper selection gate). The memory layer 54 is provided between the stacked body ML and the semiconductor body 50.

The semiconductor body 50 is electrically connected to the base semiconductor layer 10. The conductive portion 57 extends through the stacked body ML in the Z-axis direction. The conductive portion 57 may spread along the Z-X plane. The semiconductor body 50 and the conductive portion 57 are electrically connected via the base semiconductor layer 10.

The conductive portion 57 includes a metal (e.g., tungsten, etc.). The conductive portion 57 may include, for example, a semiconductor (polysilicon including an impurity, etc.). An insulating film 57i is provided between the conductive portion 57 and the stacked body ML.

An insulating film 71 is provided on the stacked body ML. An insulating film 72 is provided on the insulating film 71. An insulating film 73 is provided on the insulating film 72. An insulating film 74 is provided on the insulating film 73. An insulating film 75 is provided on the insulating film 74.

In the connection region CR, the end portions of the multiple conductive layers 21 have a staircase configuration. A connecting body 81 (e.g., a contact plug) is provided on each of the multiple conductive layers 21. For example, the connecting body 81 has a columnar configuration extending in the Z-axis direction. The connecting body 81 is electrically connected to one of the multiple conductive layers 21. The connecting body 81 includes a conductive material (e.g., tungsten, etc.). An insulating portion 66i is provided at the periphery of the connecting body 81.

A barrier metal film 81a is provided between the connecting body 81 and the insulating portion 66i. The barrier metal film 81a is provided also between the connecting body 81 and the conductive layer 21 electrically connected to the connecting body 81. The barrier metal film 81a is a film including a metal. The barrier metal film 81a includes, for example, titanium. The barrier metal film 81a may be a film including titanium nitride.

In the memory region MR, a connecting body 82 is provided on the semiconductor body 50. A connecting body 83 is provided on the connecting body 82. For example, multiple bit lines 91 that extend in the Y-axis direction are provided on the connecting body 83. The semiconductor body 50 and one of the multiple bit lines 91 are electrically connected via the connecting bodies 82 and 83.

A connecting body 84 is provided on the conductive portion 57. A source line SL is provided on the connecting body 84. The conductive portion 57 and the source line SL are connected via the connecting body 84.

In the connection region CR, a connecting body 85 is provided on the connecting body 81. For example, an interconnect 93 that extends in the Y-axis direction is provided on the connecting body 85. The connecting body 81 and the interconnect 93 are connected via the connecting body 85. The connecting bodies 82, 83, 84, and 85 are, for example, contact plugs.

The first insulating film 54a and the second insulating film 54b may include, for example, at least one of $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, or AlSiO. The memory film 54c is, for example, silicon nitride.

In the semiconductor memory device 112, the configuration described in reference to the semiconductor memory device 110 is applicable to the first semiconductor region 51 and the second semiconductor region 52. In the semiconductor memory device 112, the configuration described in reference to the semiconductor memory device 110 or the configuration described in reference to the semiconductor memory device 111 is applicable to the semiconductor body 50.

In the semiconductor memory device 112 as well, the decrease of the current (e.g., $I_{cell}$) can be suppressed; and stable operations are obtained.

Figure 7:
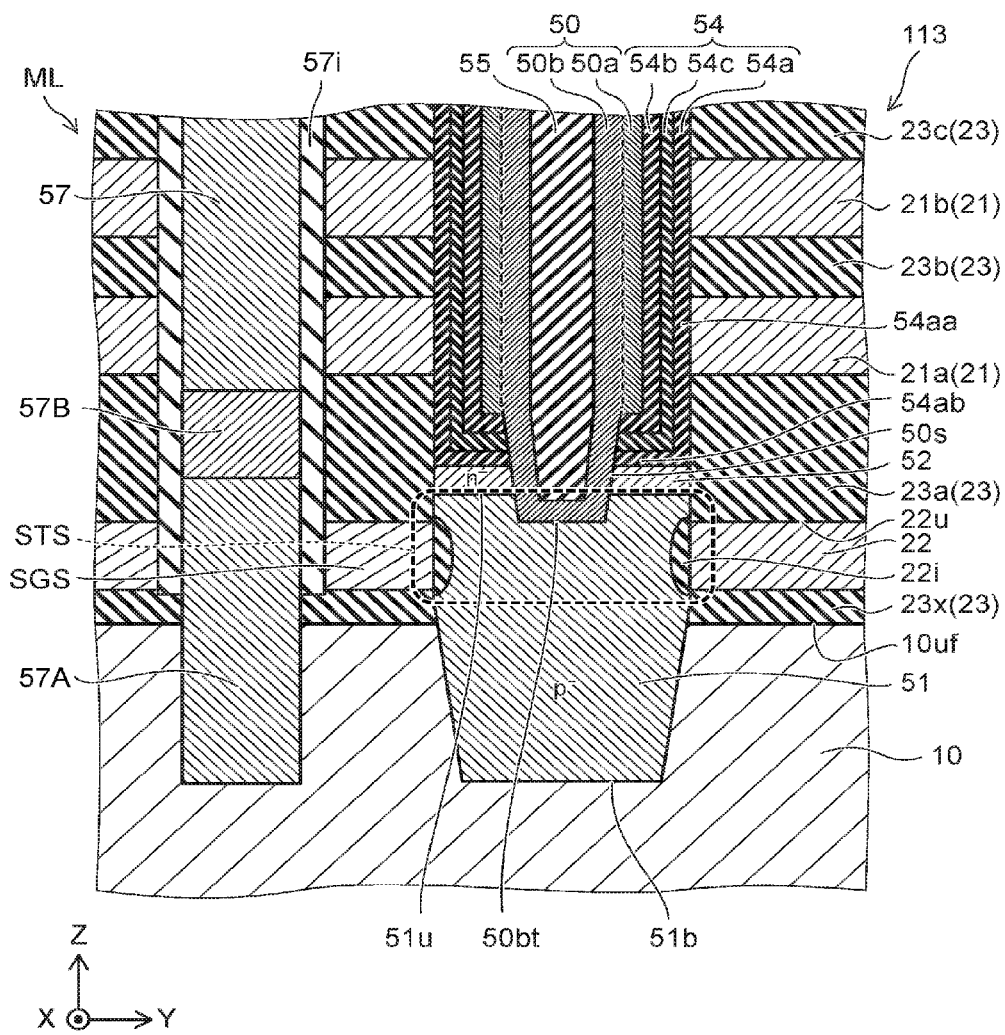
FIG. 7 is a schematic cross-sectional view illustrating another semiconductor memory device according to the first embodiment.

FIG. 7 is a schematic cross-sectional view illustrating another semiconductor memory device according to the first embodiment.

As shown in FIG. 7, the base semiconductor layer 10, the first conductive layer 21a, the second conductive layer 22, the semiconductor body 50, the memory layer 54, the first semiconductor region 51, the second semiconductor region 52, and the insulating portion 22i are provided in the other semiconductor memory device 113 according to the embodiment as well. The conductive portion 57 and an intermediate semiconductor region (a second intermediate semiconductor region 57B) are further provided in the semiconductor memory device 113. In the example, a first intermediate semiconductor region 57A is further provided. Otherwise, the semiconductor memory device 113 is similar to the semiconductor memory device 110 (or the semiconductor memory device 112); and a description is therefore omitted.

The conductive portion 57 is separated from the semiconductor body 50 along an other direction (one direction in the X-Y plane) perpendicular to the Z-axis direction. The other direction is, for example, the Y-axis direction. The conductive portion 57 extends at least in the Z-axis direction. The conductive portion 57 may have a plate configuration aligned with the Z-X plane. For example, the conductive portion 57 is used as the source member. For example, the conductive portion 57 is electrically connected to the source line SL (referring to FIG. 6).

The second intermediate semiconductor region 57B is provided between the base semiconductor layer 10 and the conductive portion 57. The second intermediate semiconductor region 57B is electrically connected to the base semiconductor layer 10 and the conductive portion 57. At least a portion of the second intermediate semiconductor region 57B overlaps the semiconductor body 50 in one direction in the X-Y plane.

The first intermediate semiconductor region 57A is provided between the base semiconductor layer 10 and the second intermediate semiconductor region 57B. For example, the first intermediate semiconductor region 57A is formed by epitaxial growth on a portion of the base semiconductor layer 10. For example, the second intermediate semiconductor region 57B is formed by ion implantation on the first intermediate semiconductor region 57A. The second intermediate semiconductor region 57B may be formed by epitaxial growth. For example, the conductive portion 57 is formed by CVD, etc., on the second intermediate semiconductor region 57B.

The conductive portion 57 is electrically connected to the base semiconductor layer 10 via the first intermediate semiconductor region 57A and the second intermediate semiconductor region 57B.

In the semiconductor memory device 113, the concentration of the impurity of at least a portion of the second intermediate semiconductor region 57B is higher than the concentration of the impurity of the base semiconductor layer 10. For example, the impurity included in the at least a portion of the second intermediate semiconductor region 57B is of the second conductivity type (e.g., the n-type). The impurity included in the second intermediate semiconductor region 57B includes, for example, at least one of arsenic or phosphorus. For example, the at least a portion of the second intermediate semiconductor region 57B is of the second conductivity type (e.g., the n⁺-semiconductor region). On the other hand, for example, the base semiconductor layer 10 is an undoped semiconductor region.

For example, the first intermediate semiconductor region 57A may be of the first conductivity type (e.g., the p-type) or may be undoped.

In the semiconductor memory device 113 as well, the decrease of the current (e.g., $I_{cell}$) can be suppressed; and stable operations are obtained. The second intermediate semiconductor region 57B that has the high impurity concentration is provided on the first intermediate semiconductor region 57A. Thereby, the distance along the current path between the source-side selection transistor STS and the second intermediate semiconductor region 57B can be long. For example, the fluctuation of the threshold characteristics of the source-side selection transistor STS due to the diffusion of the n-type impurity included in the second intermediate semiconductor region 57B can be suppressed.

The configurations of such a first intermediate semiconductor region 57A and such a second intermediate semiconductor region 57B are applicable also to the semiconductor memory devices 112 and 113.

Second Embodiment

Figure 8A:
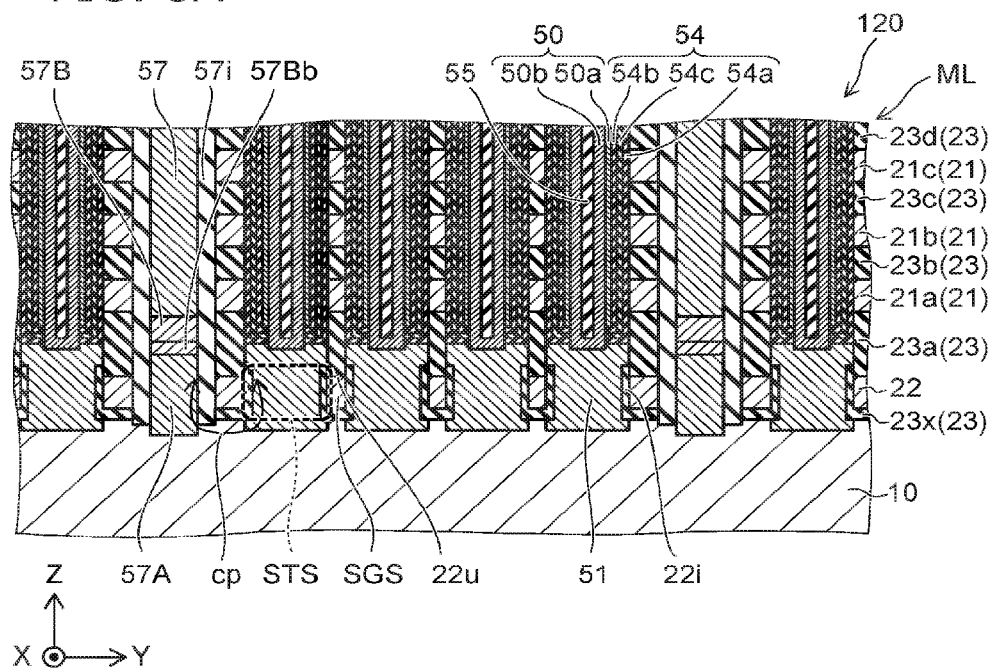
FIG. 8A and FIG. 8B are schematic views illustrating a semiconductor memory device according to a second embodiment.
Figure 8B:
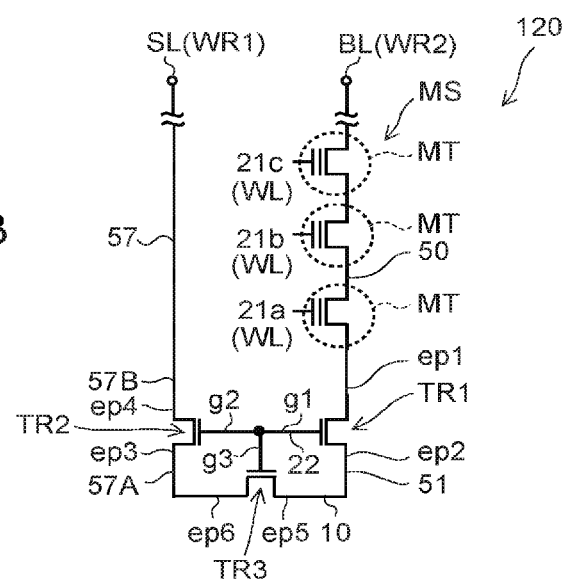

FIG. 8A and FIG. 8B are schematic views illustrating a semiconductor memory device according to a second embodiment.

FIG. 8A is a cross-sectional view. FIG. 8B is an equivalent circuit diagram corresponding to a portion of the memory region MR.

As shown in FIG. 8A, the semiconductor memory device 120 according to the embodiment includes the base semiconductor layer 10, the first conductive layer 21a, the second conductive layer 22, the semiconductor body 50, the memory layer 54, the conductive portion 57, and the first intermediate semiconductor region 57A.

In the example as well, the first conductive layer 21a is separated from the base semiconductor layer 10 in the Z-axis direction. The first conductive layer 21a is included in the multiple conductive layers 21. The second conductive layer 22 is provided between the base semiconductor layer 10 and the first conductive layer 21a. These conductive layers (the conductive layers 21 including the first conductive layer 21a, the conductive layer 21b, the conductive layer 21c, etc.) and the insulating layers 23x and 23 are included in the stacked body ML. The semiconductor body 50 extends through the first conductive layer 21a in the Z-axis direction. The memory layer 54 is provided between the semiconductor body 50 and the first conductive layer 21a. The configurations described in reference to the semiconductor memory devices 110 to 113 are applicable to the stacked body ML, the semiconductor body 50, and the memory layer 54.

The conductive portion 57 is separated from the semiconductor body 50 along the other direction (one direction in the X-Y plane) perpendicular to the Z-axis direction. The other direction is, for example, the Y-axis direction. The conductive portion 57 extends at least in the Z-axis direction. The conductive portion 57 may have a plate configuration aligned with the Z-X plane. The conductive portion 57 is electrically connected to the source line SL (not illustrated in FIG. 8A). The insulating film 57i is provided between the conductive portion 57 and the conductive layers (the conductive layer 21, the second conductive layer 22, etc.).

The first intermediate semiconductor region 57A is provided between the base semiconductor layer 10 and the conductive portion 57. The first intermediate semiconductor region 57A is separated from the second conductive layer 22 in the other direction (e.g., the Y-axis direction).

Thus, in the semiconductor memory device 120, the first intermediate semiconductor region 57A is provided between the base semiconductor layer 10 and the conductive portion 57; and the first intermediate semiconductor region 57A is arranged with the second conductive layer 22 (e.g., the source-side selection gate SGS) in the Y-axis direction. In other words, an ES (Elevated Source) structure is applied. The second conductive layer 22 is used as at least a portion of the gate electrode (the source-side selection gate SGS) of the source-side selection transistor STS.

By providing such an ES structure between the conductive portion 57 (the source member) and the base semiconductor layer 10, a current path cp that is between the lower portion of the conductive portion 57 and the channel portion of the source-side selection transistor STS can be long. Thereby, for example, the negative effects of the impurity included in the lower portion of the conductive portion 57, etc., on the channel portion can be suppressed. In the semiconductor memory device 120, the cut-off characteristics of the source-side selection transistor STS can be good.

In the example, the second intermediate semiconductor region 57B is further provided between the base semiconductor layer 10 and the first intermediate semiconductor region 57A. The second intermediate semiconductor region 57B is, for example, a high impurity concentration region. For example, the concentration of the impurity of the second intermediate semiconductor region 57B is higher than the concentration of the impurity of the base semiconductor layer 10. For example, the impurity included in the second intermediate semiconductor region 57B is an impurity of the second conductivity type and includes, for example, at least one of arsenic or phosphorus. For example, the concentration of the impurity of the second intermediate semiconductor region 57B is higher than the concentration of the impurity of the first intermediate semiconductor region 57A.

In the semiconductor memory device 120, the second intermediate semiconductor region 57B that has the high impurity concentration is provided on the first intermediate semiconductor region 57A having the ES structure. For example, the movement of the impurity included in the second intermediate semiconductor region 57B into the channel region of the source-side selection transistor STS can be suppressed.

For example, a reference example may be considered in which a semiconductor region having a high impurity concentration is provided on (the surface portion) of the base semiconductor layer 10 without providing the first intermediate semiconductor region 57A. In the reference example, the distance between the semiconductor region having the high impurity concentration and the channel region of the source-side selection transistor STS is short. Therefore, it is easy for the impurity (e.g., the n-type impurity) included in the semiconductor region having the high impurity concentration to diffuse, for example, during heat treatment (annealing to relax the warp, etc.) and move into the channel region of the source-side selection transistor STS. It is considered that this phenomenon occurs markedly in the semiconductor body 50 proximal to the conductive portion 57 in the case where the multiple semiconductor bodies 50 are provided. For example, the cut-off characteristics of the source-side selection transistor STS easily degrade in the semiconductor body 50 proximal to the conductive portion 57. For example, the threshold decreases easily. For example, the fluctuation of the threshold becomes large. For example, it is considered that this phenomenon occurs particularly markedly in the case where the distance between the semiconductor body 50 and the conductive portion 57 is reduced to reduce the memory region MR of the semiconductor memory device.

Conversely, in the embodiment, the first intermediate semiconductor region 57A is provided between the base semiconductor layer 10 and the conductive portion 57. The first intermediate semiconductor region 57A is arranged with the second conductive layer 22 (the source-side selection gate SGS) in the other direction; that is, the ES structure is applied. Thereby, for example, even in the case where the distance between the semiconductor body 50 and the conductive portion 57 is reduced, the negative effects of the impurity of the lower portion of the conductive portion 57 on the source-side selection transistor STS can be suppressed. For example, it is easier to maintain the desired state of the threshold. For example, the fluctuation of the threshold can be small. Stable operations are obtained. The memory region MR can be reduced easily.

In the semiconductor memory device 120, the conductive portion 57 is provided on the base semiconductor layer 10. In such a case, at least a portion of the second intermediate semiconductor region 57B is positioned higher than the upper end portion 22u of the second conductive layer 22. For example, a lower end portion 57Bb of the second intermediate semiconductor region 57B is positioned higher than the upper end portion 22u of the second conductive layer 22. Thereby, the distance along the current path cp between the second intermediate semiconductor region 57B having the high impurity concentration and the channel region of the source-side selection transistor STS can be long. Thereby, the negative effects of the impurity included in the second intermediate semiconductor region 57B on the source-side selection transistor STS can be suppressed with higher certainty.

In the semiconductor memory device 120 of the example, the first semiconductor region 51 is provided between the semiconductor body 50 and the base semiconductor layer 10. In the example, the first semiconductor region 51 may be an undoped semiconductor region or may be, for example, a p⁻-semiconductor region. In the example, the second semiconductor region 52 described in reference to the first embodiment may be provided.

The circuit configuration shown in FIG. 8B is provided in the semiconductor memory device 120. The semiconductor memory device 120 includes a memory string MS, a first transistor TR1, a second transistor TR2, a first interconnect WR1, and a second interconnect WR2. A third transistor TR3 is further provided in the example.

The memory string MS includes multiple memory transistors MT. The multiple memory transistors MT are connected in series to each other. In the memory transistors MT, the first conductive layer 21a, the conductive layers 21b and 21c, etc., are used respectively as the gates of the multiple memory transistors MT; and these gates are used as the word lines WL. The semiconductor body 50 is used as the channel of the memory transistors MT.

The first transistor TR1 includes a first end portion ep1, a second end portion ep2, and a first gate g1. The first end portion ep1 is electrically connected to an end of the memory string MS.

The second transistor TR2 includes a third end portion ep3, a fourth end portion ep4, and a second gate g2. The third end portion ep3 is electrically connected to the second end portion ep2. The second gate g2 is continuous with the first gate g1.

The first interconnect WR1 is electrically connected to the fourth end portion ep4 of the second transistor TR2. In the example, the first interconnect WR1 and the fourth end portion ep4 are electrically connected by the conductive portion 57. The first interconnect WR1 is, for example, the source line SL. The second interconnect WR2 is electrically connected to the other end of the memory string MS. The second interconnect WR2 is, for example, a bit line BL.

The third transistor TR3 is provided in the example. The third transistor TR3 includes a fifth end portion ep5, a sixth end portion ep6, and a third gate g3. The fifth end portion ep5 is electrically connected to the second end portion ep2. The sixth end portion ep6 is electrically connected to the third end portion ep3. In other words, the second end portion ep2 and the third end portion ep3 are electrically connected by the channel of the third transistor TR3. The third gate g3 is continuous with the first gate g1 and the second gate g2.

For example, at least a portion of the first semiconductor region 51 is used as the channel of the first transistor TR1. At least a portion of the first intermediate semiconductor region 57A is used as at least a portion of the second transistor TR2. At least a portion of the base semiconductor layer 10 is used as at least a portion of the third transistor TR3. At least a portion of the second conductive layer 22 is used as the first gate g1 and the second gate. At least a portion of the second conductive layer 22 may be used as the third gate g3.

An example of the method for manufacturing the semiconductor memory device 120 will now be described.

FIG. 9 to FIG. 18 are schematic cross-sectional views in order of the processes, illustrating the method for manufacturing the semiconductor memory device according to the second embodiment.

Figure 9:
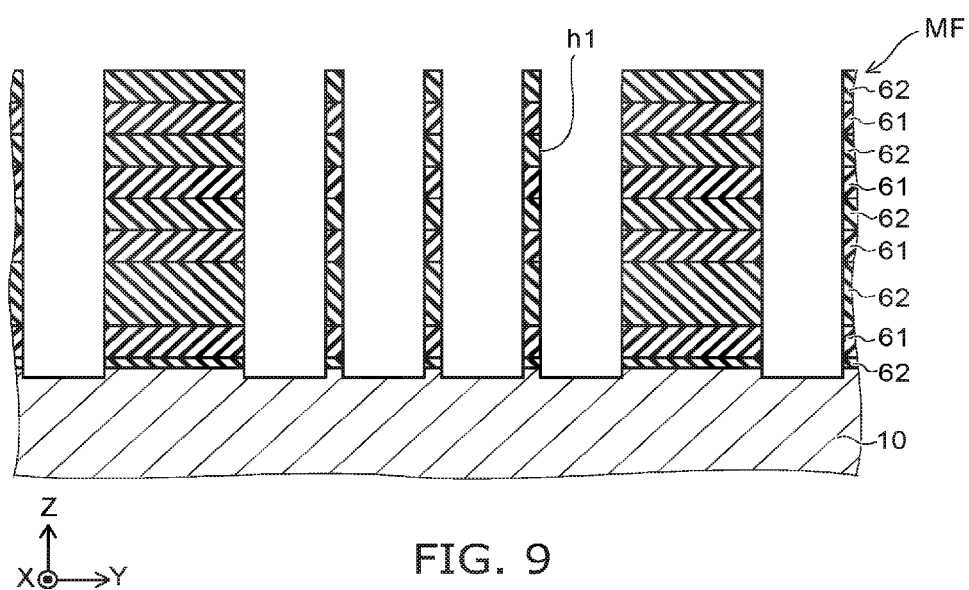
FIG. 9 is schematic cross-sectional views in order of the processes, illustrating a method for manufacturing the semiconductor memory device according to the second embodiment.

As shown in FIG. 9, the base semiconductor layer 10 is prepared; the stacked film MF is formed on the base semiconductor layer 10; and holes h1 (e.g., the memory holes) are formed in the stacked film MF. As described below, a circuit (e.g., peripheral transistors, etc.) may be formed in the base semiconductor layer 10. The first films 61 (e.g., the silicon nitride films) and the second films 62 (e.g., the silicon oxide films) are stacked alternately in the stacked film MF. As described below, the semiconductor body 50 is formed in the holes h1. The holes h1 correspond to the first recesses DP1 described above.

Figure 10:
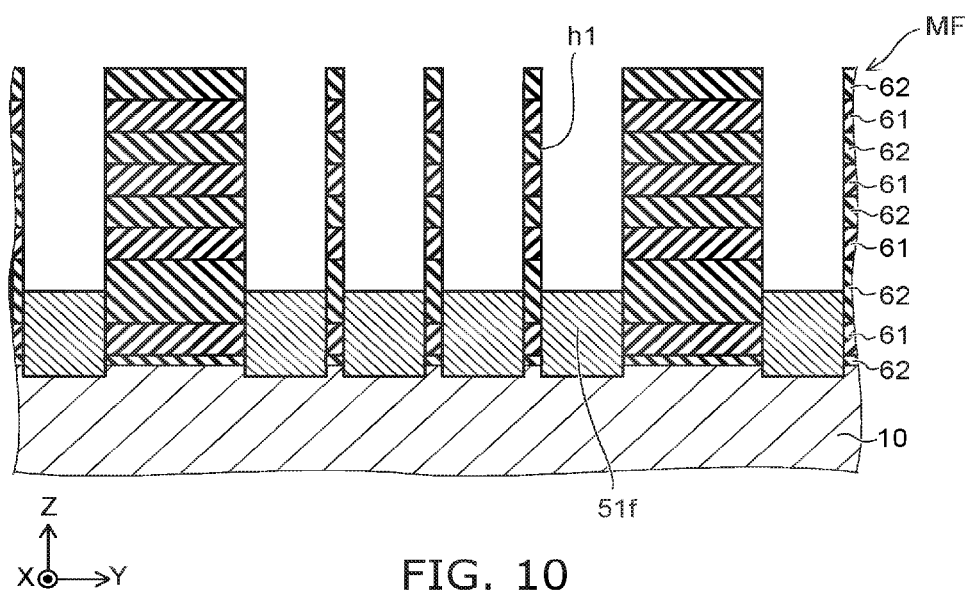
FIG. 10 is schematic cross-sectional views in order of the processes, illustrating a method for manufacturing the semiconductor memory device according to the second embodiment.

As shown in FIG. 10, for example, selective epitaxial growth of the semiconductor film 51f (e.g., the silicon film) on the lower portions of the holes h1 is performed.

Figure 11:
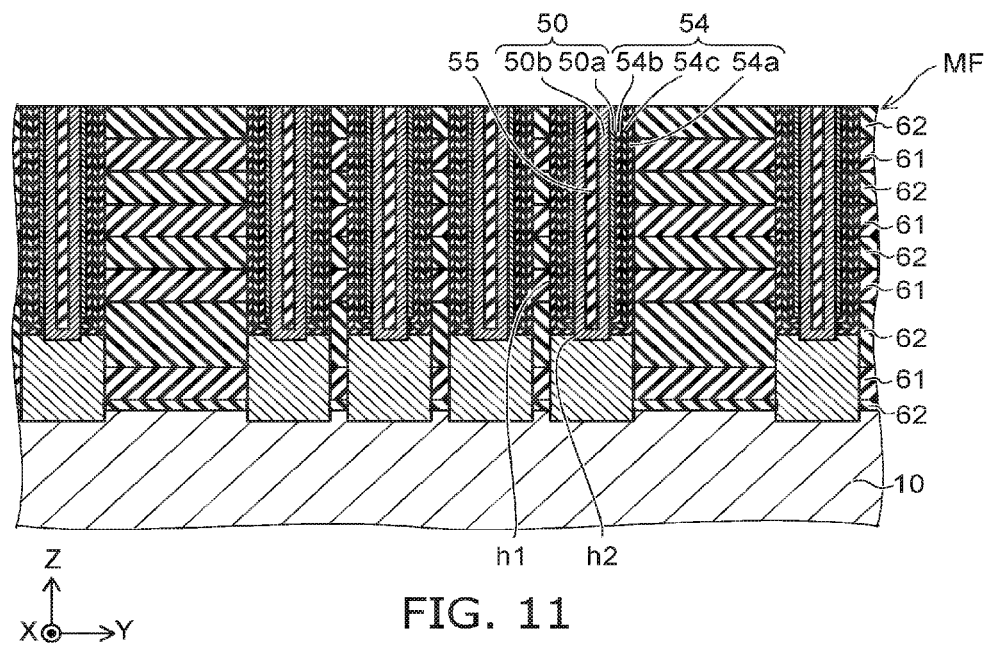
FIG. 11 is schematic cross-sectional views in order of the processes, illustrating a method for manufacturing the semiconductor memory device according to the second embodiment.

As shown in FIG. 11, the memory layer 54 (the first insulating film 54a, the memory film 54c, and the second insulating film 54b) and the first semiconductor body film 50a are formed in the interiors of the holes h1. Subsequently, holes h2 are formed in the memory layer 54 corresponding to the bottom portions of the holes h1; further, the second semiconductor body film 50b is formed. Thereby, the semiconductor body 50 that has the tubular configuration is formed. Subsequently, the core insulating layer 55 is formed by filling an insulating film into the remaining space.

Figure 12:
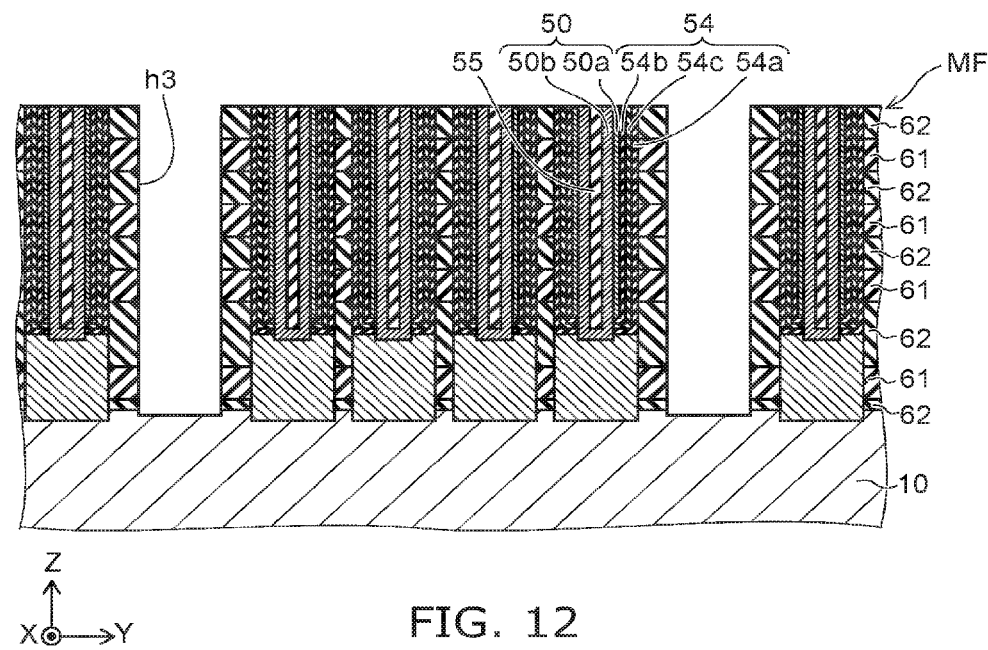
FIG. 12 is schematic cross-sectional views in order of the processes, illustrating a method for manufacturing the semiconductor memory device according to the second embodiment.

As shown in FIG. 12, holes h3 (slits or trenches) are formed in the stacked film MF. For example, the slits spread along the Z-X plane.

Figure 13:
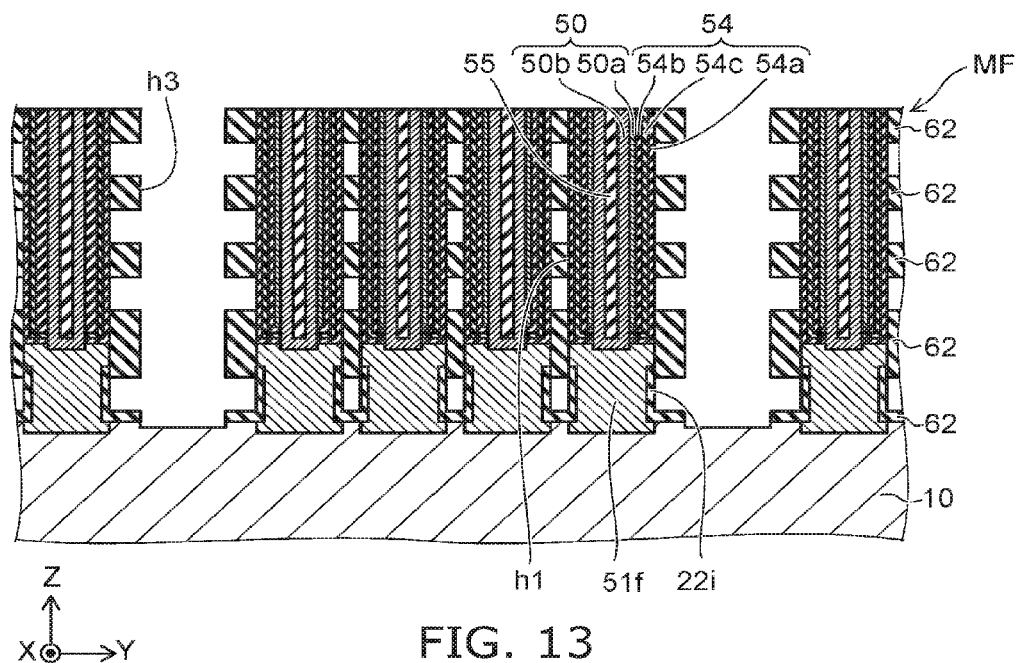
FIG. 13 is schematic cross-sectional views in order of the processes, illustrating a method for manufacturing the semiconductor memory device according to the second embodiment.

As shown in FIG. 13, the first films 61 are removed via the holes h3 (the slits or the trenches). Thereby, a portion (the side surface portion) of the semiconductor film 51f is exposed. Subsequently, the side surface portion of the semiconductor film 51f is oxidized. Thereby, at least a portion of the insulating portion 22i is formed.

Figure 14:
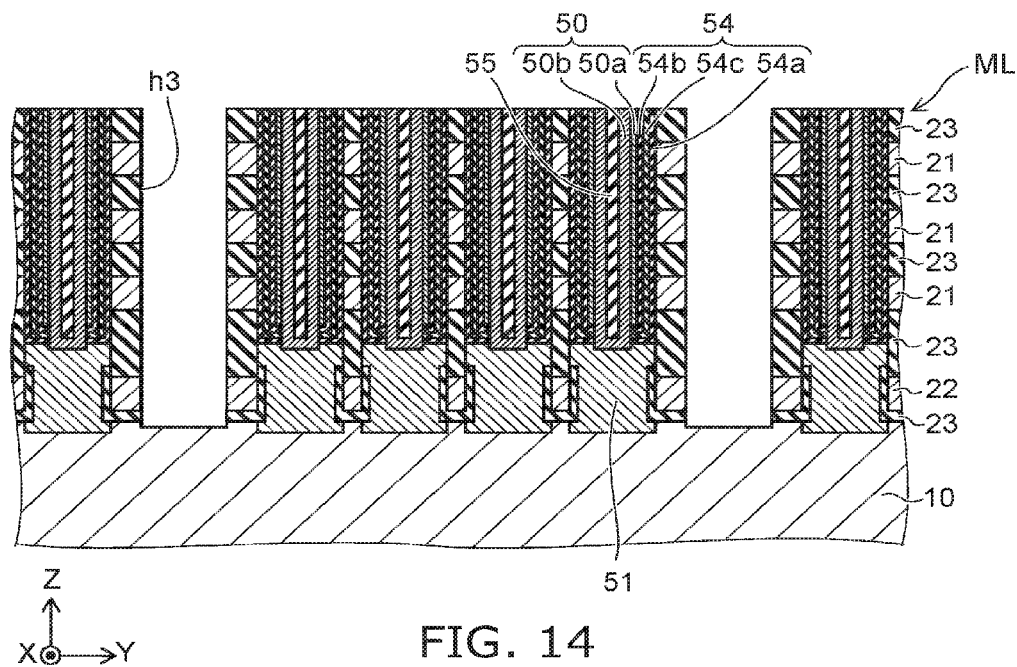
FIG. 14 is schematic cross-sectional views in order of the processes, illustrating a method for manufacturing the semiconductor memory device according to the second embodiment.

As shown in FIG. 14, for example, a conductive material is filled into the space formed where the first films 61 are removed; and, for example, isotropic etch-back is performed. Thereby, the conductive layers 21 are formed. Prior to filling the conductive material, for example, a high dielectric constant film (e.g., aluminum oxide, etc.) may be formed; further, a barrier metal film (e.g., TiN, etc.) may be formed. The second films 62, the high dielectric constant film, etc., are used to form the insulating layers 23. Thus, a "replacement method" is used in the manufacturing method.

Figure 15:
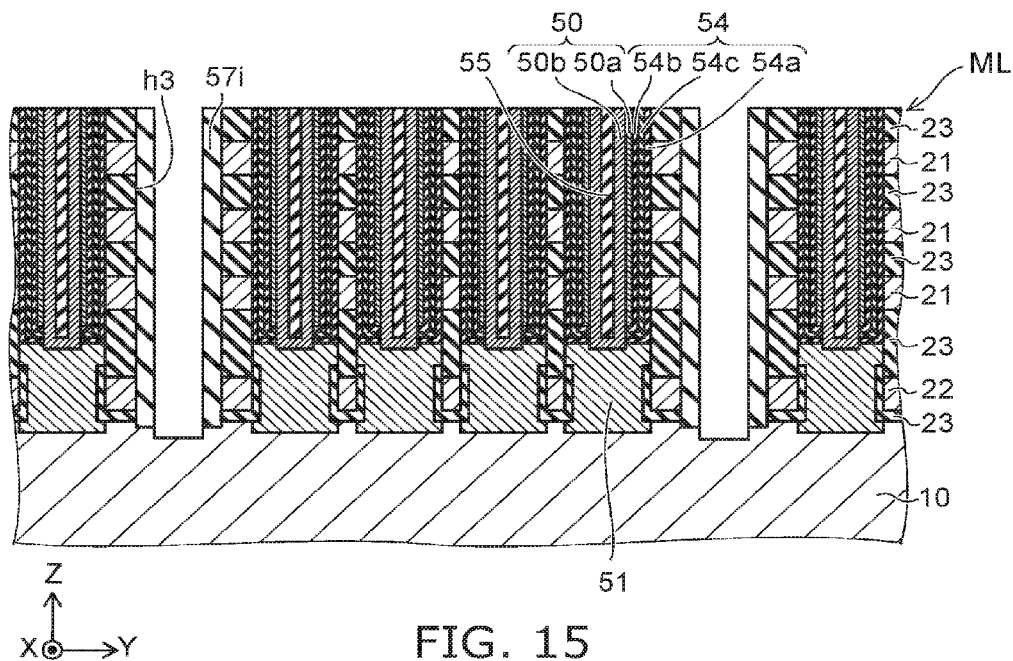
FIG. 15 is schematic cross-sectional views in order of the processes, illustrating a method for manufacturing the semiconductor memory device according to the second embodiment.

As shown in FIG. 15, the insulating film 57i is formed on the wall surfaces of the holes h3 (the slits or the trenches).

Figure 16:
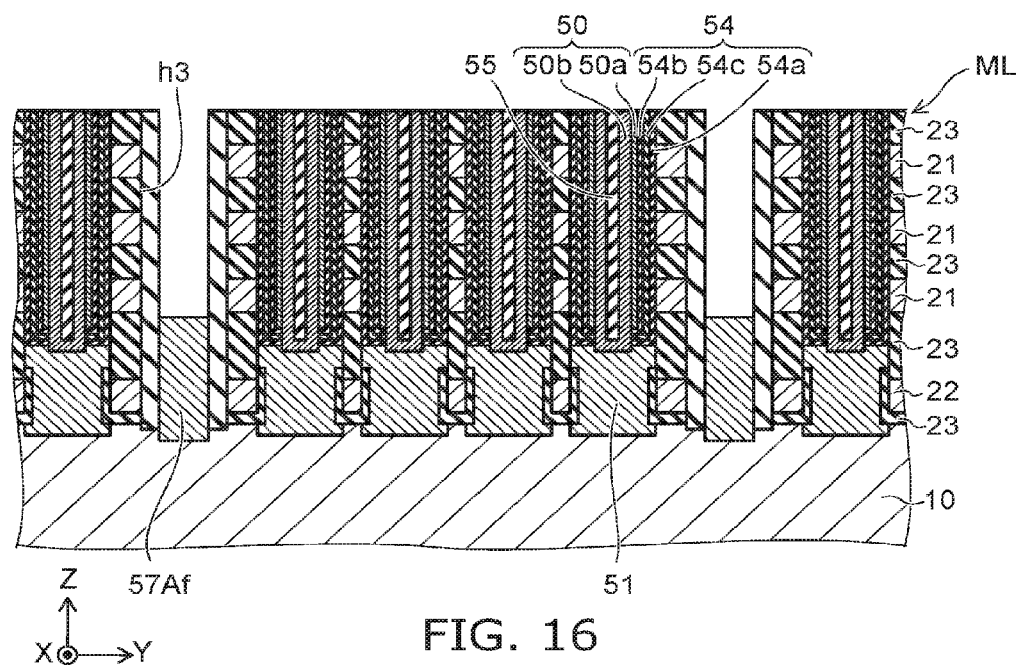
FIG. 16 is schematic cross-sectional views in order of the processes, illustrating a method for manufacturing the semiconductor memory device according to the second embodiment.

As shown in FIG. 16, for example, selective epitaxial growth of a semiconductor film 57Af is performed on the lower portions of the holes h3 (the slits or the trenches).

Figure 17:
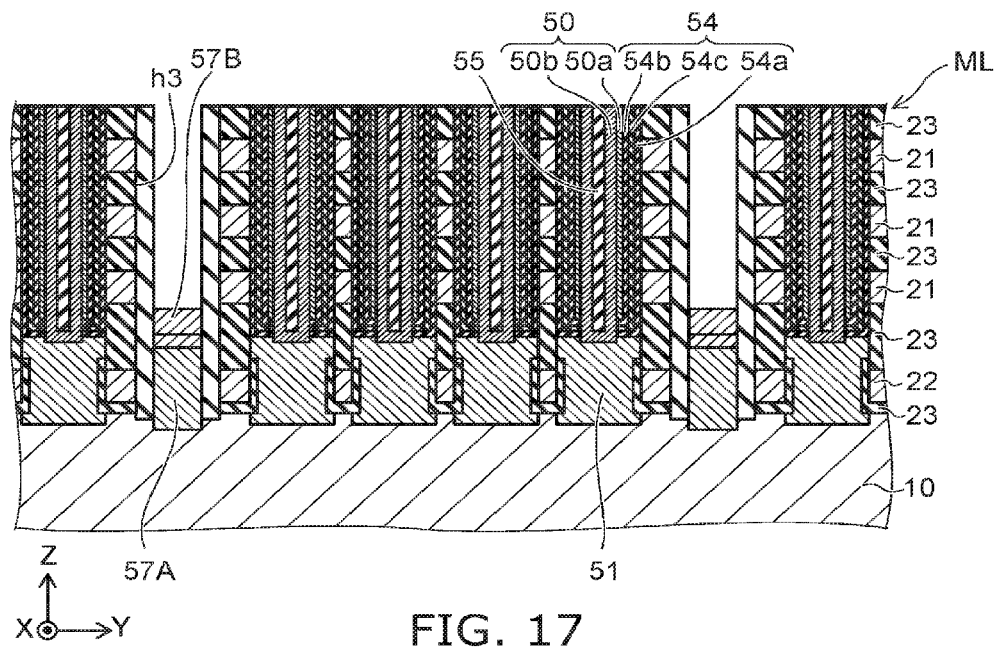
FIG. 17 is schematic cross-sectional views in order of the processes, illustrating a method for manufacturing the semiconductor memory device according to the second embodiment.

As shown in FIG. 17, an impurity is ion-implanted into the surface portion of the semiconductor film 57Af of the lower portions of the holes h3 (the slits or the trenches). The impurity is, for example, As. The portion where the impurity is implanted is used to form the second intermediate semiconductor region 57B (e.g., the $n^+$-semiconductor region). The remaining portion is used to form the first intermediate semiconductor region 57A.

Figure 18:
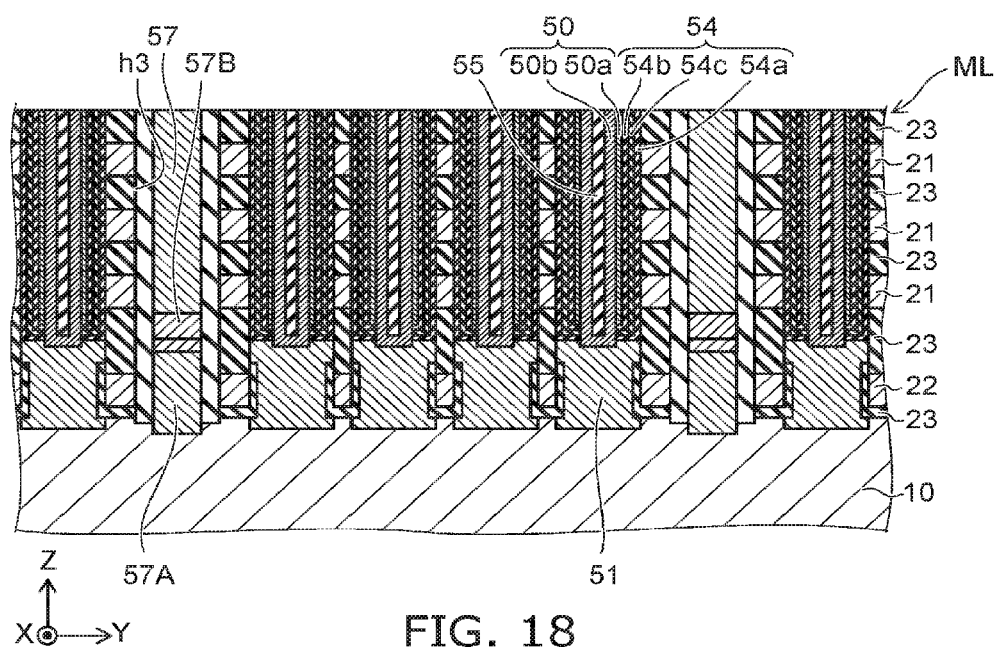
FIG. 18 is schematic cross-sectional views in order of the processes, illustrating a method for manufacturing the semiconductor memory device according to the second embodiment.

As shown in FIG. 18, the conductive portion 57 is formed by filling a conductive material into the holes h3 (the slits or the trenches). The conductive material is, for example, a stacked film of Ti—TiN—W.

Subsequently, the inter-layer insulating films are formed; the patterning of the word lines WL (the conductive layers 21, the second conductive layer 22, etc.), the formation of the contact bodies, the formation of the source line SL, the bit lines BL, etc., are performed; and the semiconductor memory device 120 is formed.

In the semiconductor memory device 120, a source line diffusion layer (the second intermediate semiconductor region 57B) is provided on epitaxial Si (the first intermediate semiconductor region 57A) that is higher than the upper surface of a Si substrate (the base semiconductor layer 10). Even if an impurity (e.g., P) diffuses due to the heating process after the formation of the source line diffusion layer, the degradation of the short-channel effect of the lower selection transistor (the source-side selection transistor STS) can be suppressed.

In the semiconductor memory device 120, for example, $n^+$-impurity diffusion into the memory hole lower portion is deterred. Therefore, a large barrier is not formed easily between the p-type well and the memory hole in the erase operation. Therefore, the erase operation is stabilized. For example, the erasing voltage decreases easily. Thereby, for example, a semiconductor memory device that has high reliability is obtained. For example, a high yield is obtained.

For example, in the case where a positive potential is applied to the lower selection transistor electrode and the transistor is in the ON state, a channel conductive layer is induced also in the surface of the semiconductor film 51f of the lower portion of the source line trench (the hole h3) due to the field effect of the same lower selection transistor electrode. Then, the region from the source line diffusion layer to the silicon substrate surface and the region of the lower selection transistor portion of the memory hole portion are switched to the conducting state.

On the other hand, in the case where a negative potential is applied to the lower selection transistor electrode and the transistor is in the OFF state, a channel is not formed in the semiconductor film 51f of the lower portion of the source line trench. The transistor that has a sufficient gate length continuous from the lower selection transistor portion of the memory hole portion can be set to the OFF state.

In the semiconductor memory device 120 recited above, at least a portion of the first intermediate semiconductor region 57A provided in the lower portion of the source line trench (the hole h3) is higher than the lower end of the gate electrode of the lower selection transistor. It is favorable for at least a portion of the first intermediate semiconductor region 57A to be positioned higher than the upper end of the gate electrode (the second conductive layer 22). Further, it is desirable for at least a portion of the first intermediate semiconductor region 57A to be positioned lower than the electrode of the word line WL of the lowermost layer. Thereby, for example, an excessively large channel resistance of the first intermediate semiconductor region 57A can be suppressed while obtaining a sufficient margin for diffusion. For example, a high-yield semiconductor memory device in which the high-speed operations are possible is obtained.

In the semiconductor memory device 120, it is desirable for the first intermediate semiconductor region 57A provided in the lower portion of the source line trench (the hole h3) to be a silicon film that is epitaxially grown. In the embodiment, the first intermediate semiconductor region 57A may be a SiGe film that is epitaxially grown. In such a case, a lower temperature of the growth temperature is possible; the effects of the heating process on the peripheral transistors can be suppressed; and, for example, a finer semiconductor memory device is easier to obtain.

The first intermediate semiconductor region 57A that is provided in the lower portion of the source line trench (the hole h3) may include a polycrystalline silicon film. The diffusion rate of an impurity in polycrystalline silicon is larger than that in a crystal. Therefore, in the case where the first intermediate semiconductor region 57A includes the polycrystalline silicon film, the height of the polycrystalline silicon film is set to be sufficiently high. Generally, the process cost and the time relating to the film formation are less for a polycrystalline film than for the epitaxial film. Therefore, by using a polycrystalline silicon film, the cost of the semiconductor memory device is reduced easily even if the height of the polycrystalline silicon film is set to be high.

To increase the memory capacity of the semiconductor memory device, not only the increase of the number of stacks of the memory cells but also the reduction of the surface area of the memory array is performed. For this purpose, it may be considered to reduce the distance between the memory hole and the impurity diffusion layer provided in the lower portion of the source line trench (the hole h3). In such a case, the lower selection transistor characteristics of the memory cell are affected by the impurity included in the impurity diffusion layer of the lower portion of the source line trench (the hole h3); and, for example, the short-channel characteristics degrade. Further, it also may be considered that hole injection when erasing becomes difficult. For example, in the case of stacked vertical memory, the heat treatment is performed at a high temperature to increase the reliability such as the data retention characteristics of the memory cells, etc. When the heat treatment is performed at a high temperature, it becomes difficult to accurately control the impurity concentration of the memory hole lower portion. Further, the aspect ratio of the etching of the memory hole and the source line trench (the hole h3) becomes high; and it also becomes difficult to accurately control the etched amount of the silicon substrate, etc. For such circumstances as well, it is desirable to suppress the interference between the source line diffusion layer and the memory hole (the memory cell MC) without increasing the surface area of the memory array.

In the embodiment, the epitaxial Si (the first intermediate semiconductor region 57A) that is provided in the lower portion of the source line trench (the hole h3) is provided above the upper surface of the Si substrate (the base semiconductor layer 10). Then, the source line diffusion layer (the second intermediate semiconductor region 57B) is provided on such a first intermediate semiconductor region 57A. Thereby, the interference between the source line diffusion layer and the memory hole (the memory cell MC) is suppressed. Thereby, the reduction of the surface area of the memory array becomes easy.

Figure 19:
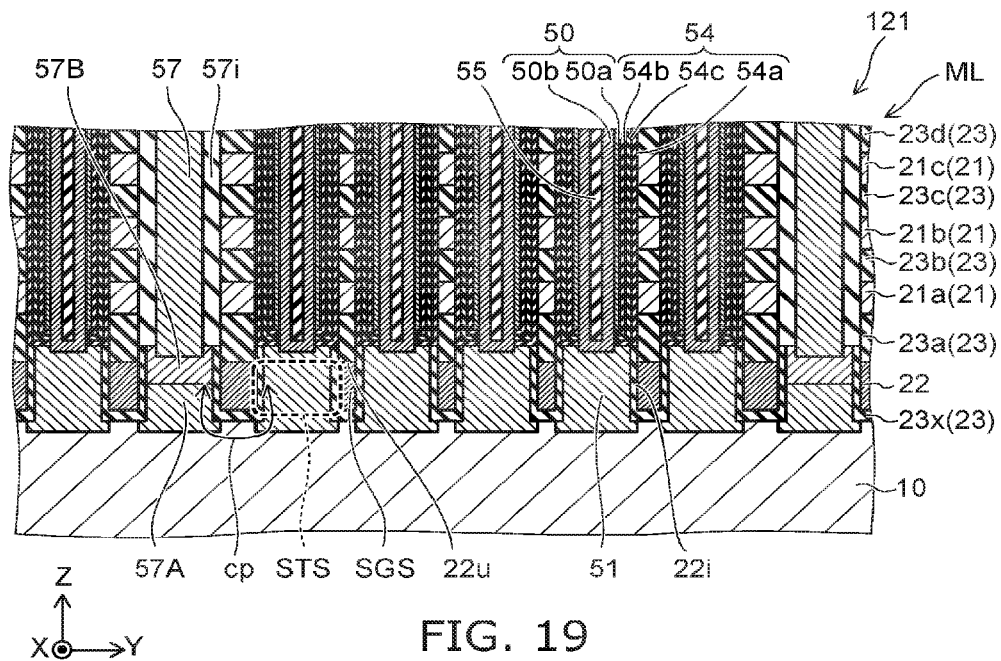
FIG. 19 is a schematic cross-sectional view illustrating another semiconductor memory device according to the second embodiment.

FIG. 19 is a schematic cross-sectional view illustrating another semiconductor memory device according to the second embodiment.

In the semiconductor memory device 121 shown in FIG. 19, for example, the material of the second conductive layer 22 is different from the material of the first conductive layer 21a (the conductive layer 21). For example, the second conductive layer 22 includes a silicide (tungsten silicide, etc.). On the other hand, the first conductive layer 21a (the conductive layer 21) includes tungsten, etc. Otherwise, the semiconductor memory device 121 is similar to the semiconductor memory device 120; and a description is therefore omitted.

In the semiconductor memory device 121 as well, the degradation of the short-channel effect of the lower selection transistor can be suppressed. For example, the $n^+$-impurity diffusion into the memory hole lower portion is deterred. For example, the erase operation stabilizes. For example, the decrease of the erasing voltage becomes easy. High reliability is obtained. A high yield is obtained.

An example of the method for manufacturing the semiconductor memory device 121 will now be described. In the following description, a description is omitted as appropriate for the portions similar to those of the description recited above for the method for manufacturing the semiconductor memory device 120.

FIG. 20 to FIG. 25 are schematic cross-sectional views in order of the processes, illustrating the method for manufacturing the other semiconductor memory device according to the second embodiment.

Figure 20:
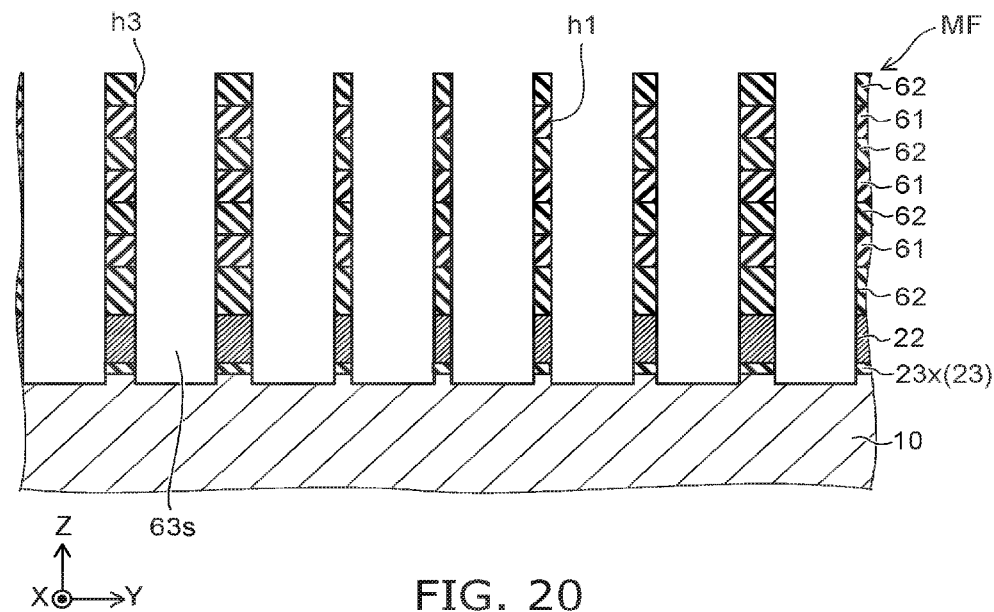
FIG. 20 is schematic cross-sectional views in order of the processes, illustrating a method for manufacturing the other semiconductor memory device according to the second embodiment.

As shown in FIG. 20, the stacked film MF is formed on the base semiconductor layer 10; and the holes h1 (e.g., the memory holes) and the holes h3 (the slits or the trenches which are the source line trenches) are formed in the stacked film MF. In the example, the stacked film MF includes the insulating layer 23x and the second conductive layer 22 provided on the insulating layer 23x. The second films 62 and the first films 61 are provided alternately on the second conductive layer 22. The second conductive layer 22 includes, for example, tungsten silicide. The insulating layer 23x includes, for example, silicon oxide.

Figure 21:
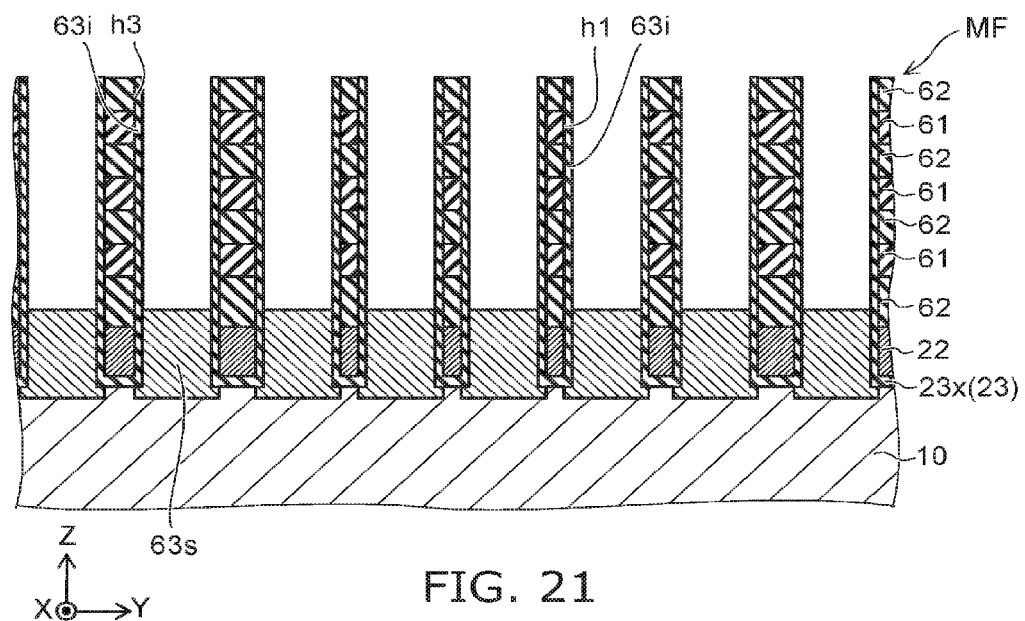
FIG. 21 is schematic cross-sectional views in order of the processes, illustrating a method for manufacturing the other semiconductor memory device according to the second embodiment.

As shown in FIG. 21, an insulating film 63i is formed in the holes h1 (e.g., the memory holes) and the holes h3 (the source line trenches); a portion of the insulating film 63i corresponding to the lower portions of these holes is removed; further, a semiconductor film 63s is formed. For example, a portion of the semiconductor film 63s is used to form the first semiconductor region 51 or the first intermediate semiconductor region 57A. For example, the semiconductor film 63s is formed by epitaxial growth.

Figure 22:
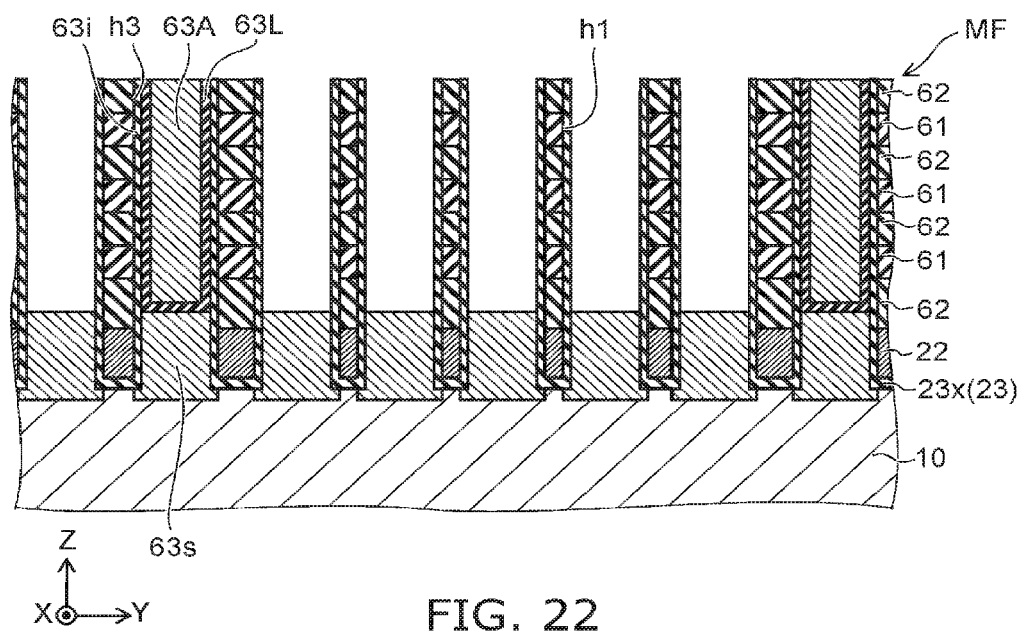
FIG. 22 is schematic cross-sectional views in order of the processes, illustrating a method for manufacturing the other semiconductor memory device according to the second embodiment.

As shown in FIG. 22, a liner film 63L (e.g., a SiN film) and an amorphous silicon film 63A are deposited in the interiors of the holes h1 and the holes h3; and after performing etch-back of the upper portion, these films that are in the hole h1 (the memory hole) interiors are removed by lithography and wet etching. The liner film 63L and the amorphous silicon film 63A are used as sacrificial layers.

Figure 23:
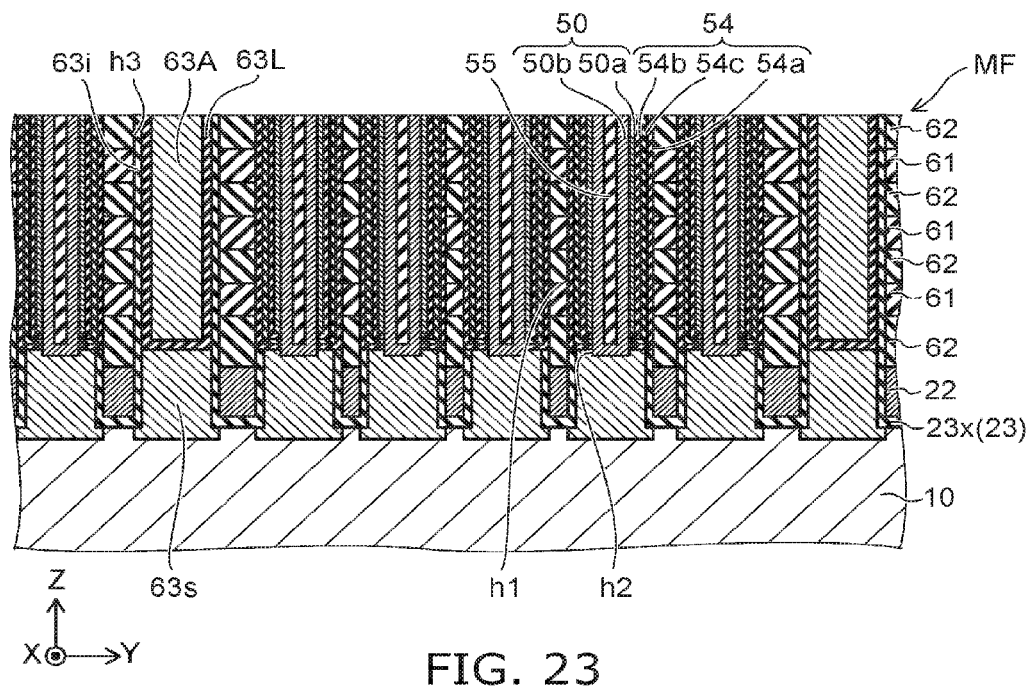
FIG. 23 is schematic cross-sectional views in order of the processes, illustrating a method for manufacturing the other semiconductor memory device according to the second embodiment.

As shown in FIG. 23, the memory layer 54, the semiconductor body 50, and the core insulating layer 55 are formed in the interiors of the holes h1 (the memory holes). For example, this is performed using the method described in reference to the semiconductor memory device 120.

Figure 24:
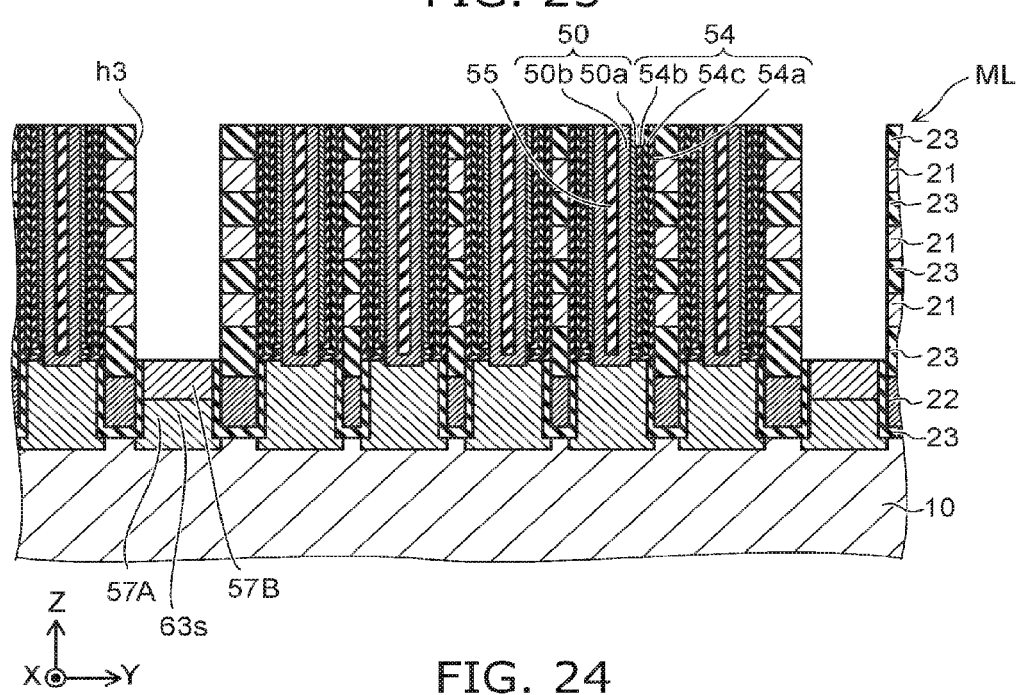
FIG. 24 is schematic cross-sectional views in order of the processes, illustrating a method for manufacturing the other semiconductor memory device according to the second embodiment.

As shown in FIG. 24, the amorphous silicon film 63A and the liner film 63L that are inside the holes h3 (the source line trenches) are removed. At this time, the insulating film 63i also may be removed. Subsequently, an impurity (e.g., As) is introduced to the surface portion of the semiconductor film 63s of the lower portion of the source line trench by ion implantation. Thereby, the source diffusion layer (the second intermediate semiconductor region 57B, e.g., the $n^+$-semiconductor region) and the first intermediate semiconductor region 57A are formed. Further, the first films 61 (e.g., the SiN films) are removed via the holes h3 (the source line trenches); for example, a high dielectric constant film (e.g., an aluminum oxide film), a barrier metal film (e.g., TiN), and a conductive material (e.g., tungsten) are filled into the space that is formed; and isotropic etch-back is performed. The conductive layers 21 are formed of the conductive material. In other words, replacing is performed.

Figure 25:
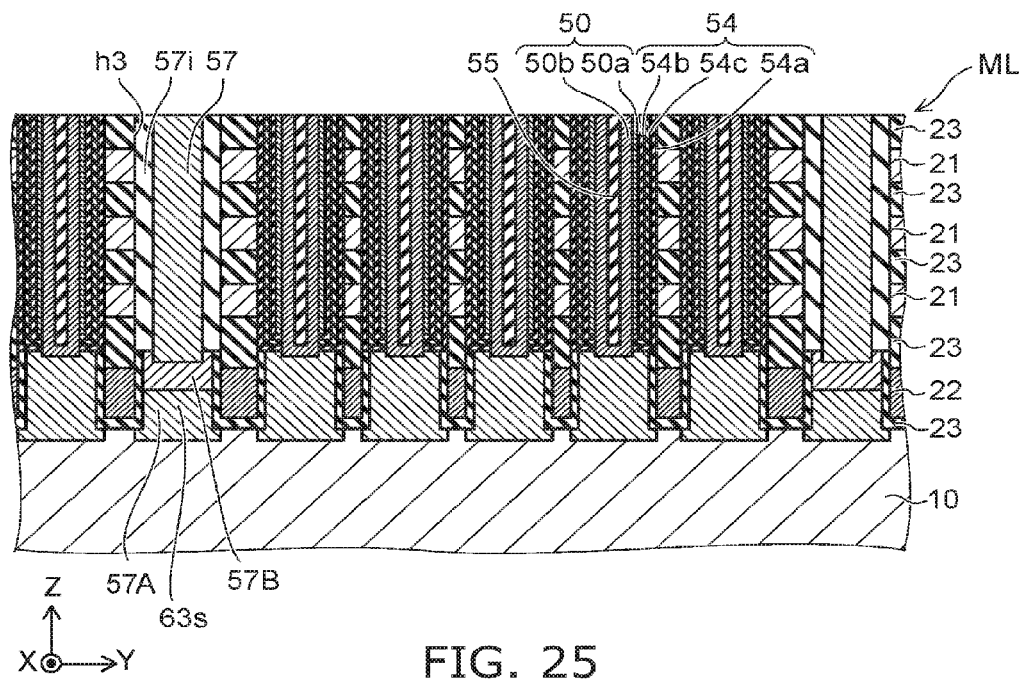
FIG. 25 is schematic cross-sectional views in order of the processes, illustrating a method for manufacturing the other semiconductor memory device according to the second embodiment.

As shown in FIG. 25, for example, the sidewall insulating film (the insulating film 57i) is formed by forming a silicon oxide film inside the holes h3 (the source line trenches). Further, the conductive portion 57 is formed by filling a conductive material (e.g., a stacked film of Ti—TiN—W) into the remaining space. Subsequently, the semiconductor memory device 121 is formed using the prescribed processes.

In the example of the method for manufacturing the semiconductor memory device 121, for example, common epitaxial growth of the semiconductor film is performed once in the memory holes and the source line trenches. Thereby, for example, the process cost can be reduced. For example, a semiconductor memory device that has a lower cost is obtained. The load of the heating process for the epitaxial growth decreases; and, for example, the degradation of the transistor characteristics of the peripheral circuit portion is suppressed. For example, a high-performance semiconductor memory device is obtained.

In the example of the method for manufacturing the semiconductor memory device 121, the gate electrode of the lower selection transistor is formed directly from the conductive film (e.g., WSi) instead of replacing from the SiN film. In the case where the replacement method is used, the degrees of freedom of the gate electrode thickness (the length in the Z-axis direction corresponding to the gate length) of the lower selection transistor are limited due to process constraints. Therefore, the gate electrode thickness of the lower selection transistor is set to be, for example, about the same as the thickness of the word line WL of the memory cell MC. Conversely, in the semiconductor memory device 121, it is possible to independently set the gate electrode thickness of the lower selection transistor. For example, the breakdown voltage can be increased by enlarging the gate length of the lower selection transistor. Thereby, for example, a semiconductor memory device that has higher reliability is obtained.

Figure 26:
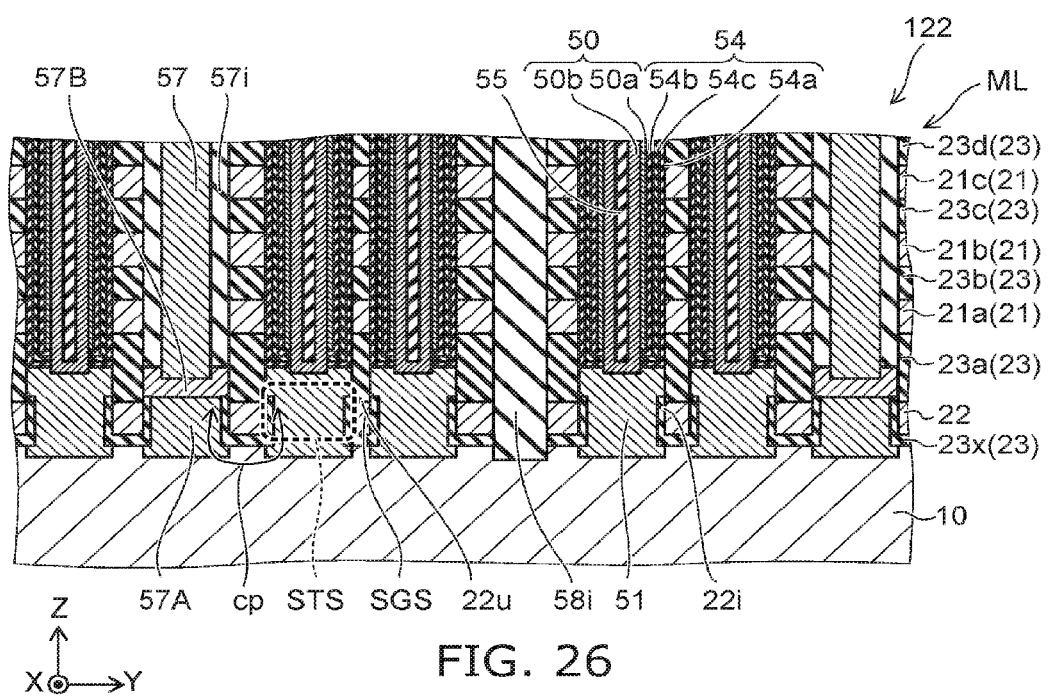
FIG. 26 is a schematic cross-sectional view illustrating another semiconductor memory device according to the second embodiment.

FIG. 26 is a schematic cross-sectional view illustrating another semiconductor memory device according to the second embodiment.

In the semiconductor memory device 122 shown in FIG. 26, for example, an insulating portion 58i is provided between the multiple semiconductor bodies 50. For example, the insulating portion 58i spreads along the Z-X plane. At least a portion of the insulating portion 58i overlaps at least a portion of the semiconductor body 50 in the Y-axis direction. Otherwise, the semiconductor memory device 122 is similar to the semiconductor memory device 120; and a description is therefore omitted.

In the semiconductor memory device 122 as well, the degradation of the short-channel effect of the lower selection transistor can be suppressed. For example, the $n^+$-impurity diffusion into the memory hole lower portion is deterred. For example, the erase operation stabilizes. For example, the decrease of the erasing voltage becomes easy. High reliability is obtained. A high yield is obtained.

An example of the method for manufacturing the semiconductor memory device 122 will now be described. In the following description, a description is omitted as appropriate for portions similar to the description recited above for the method for manufacturing the semiconductor memory device 120 or 121.

FIG. 27 to FIG. 32 are schematic cross-sectional views in order of the processes, illustrating the method for manufacturing the other semiconductor memory device according to the second embodiment.

Figure 27:
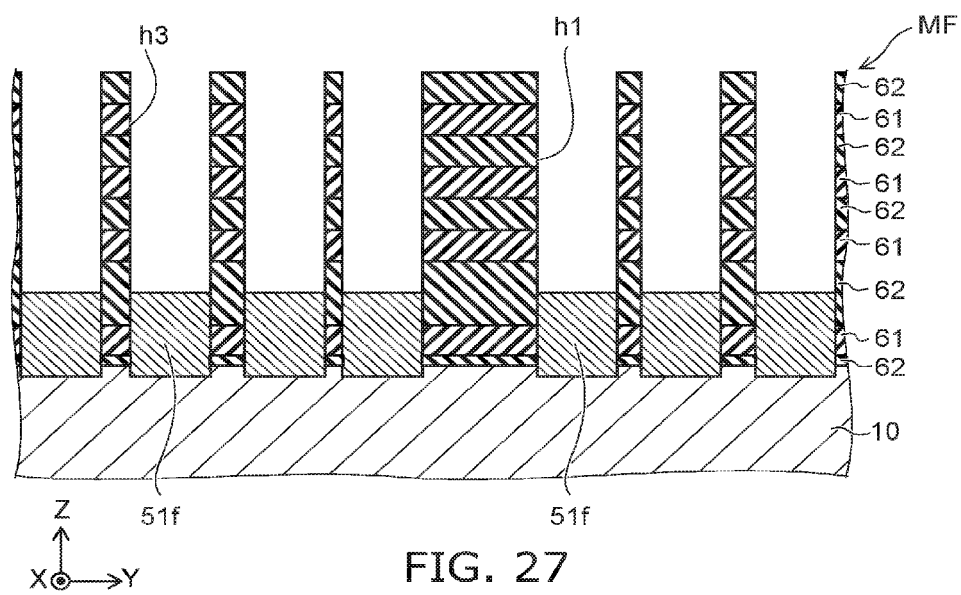
FIG. 27 is schematic cross-sectional views in order of the processes, illustrating a method for manufacturing the other semiconductor memory device according to the second embodiment.

As shown in FIG. 27, the stacked film MF is formed on the base semiconductor layer 10; and the holes h1 (e.g., the memory holes) and the holes h3 (the slits or the trenches which are the source line trenches) are formed in the stacked film MF. In the example, the second films 62 (e.g., silicon oxide) and the first films 61 (e.g., silicon nitride) are formed alternately as the stacked film MF. Further, for example, selective epitaxial growth of the semiconductor film 51f (e.g., a silicon film) is performed at the lower portions of the memory holes and the source line trenches.

Figure 28:
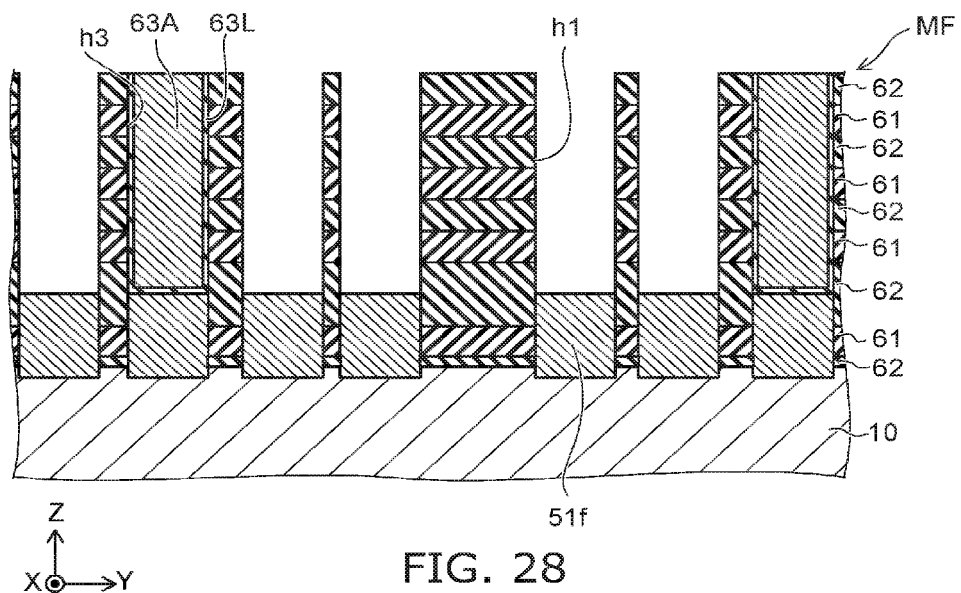
FIG. 28 is schematic cross-sectional views in order of the processes, illustrating a method for manufacturing the other semiconductor memory device according to the second embodiment.

As shown in FIG. 28, the liner film 63L (e.g., silicon oxide) and the amorphous silicon film 63A are formed; and after performing etch-back of the upper portion, these films that are in the interiors of the holes h1 (the memory holes) are removed by lithography and wet etching.

Figure 29:
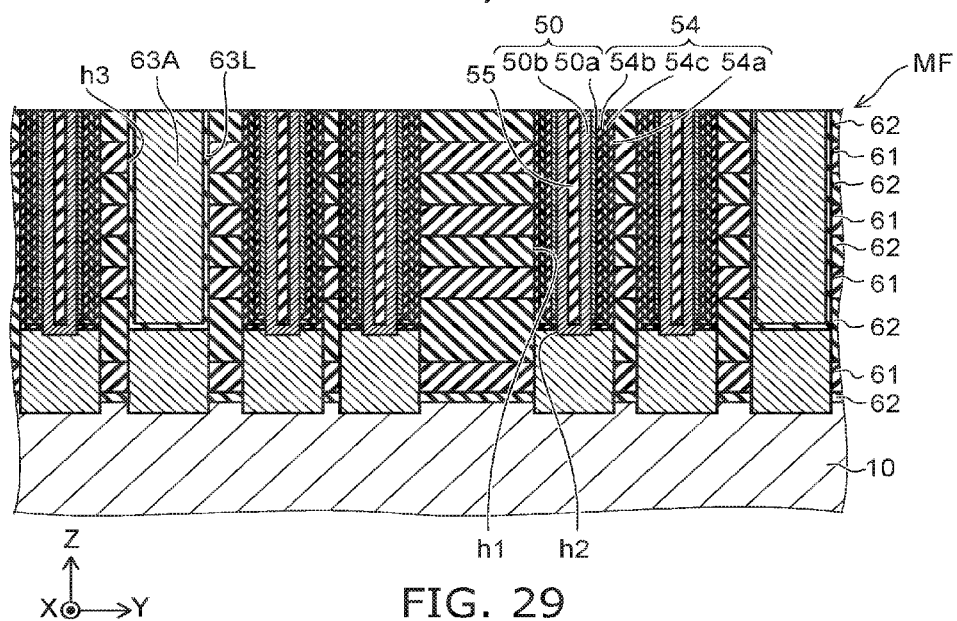
FIG. 29 is schematic cross-sectional views in order of the processes, illustrating a method for manufacturing the other semiconductor memory device according to the second embodiment.

As shown in FIG. 29, the memory layer 54, the semiconductor body 50, and the core insulating layer 55 are formed in the interiors of the holes h1 (the memory holes). For example, the method described in reference to the semiconductor memory device 120 is used.

Figure 30:
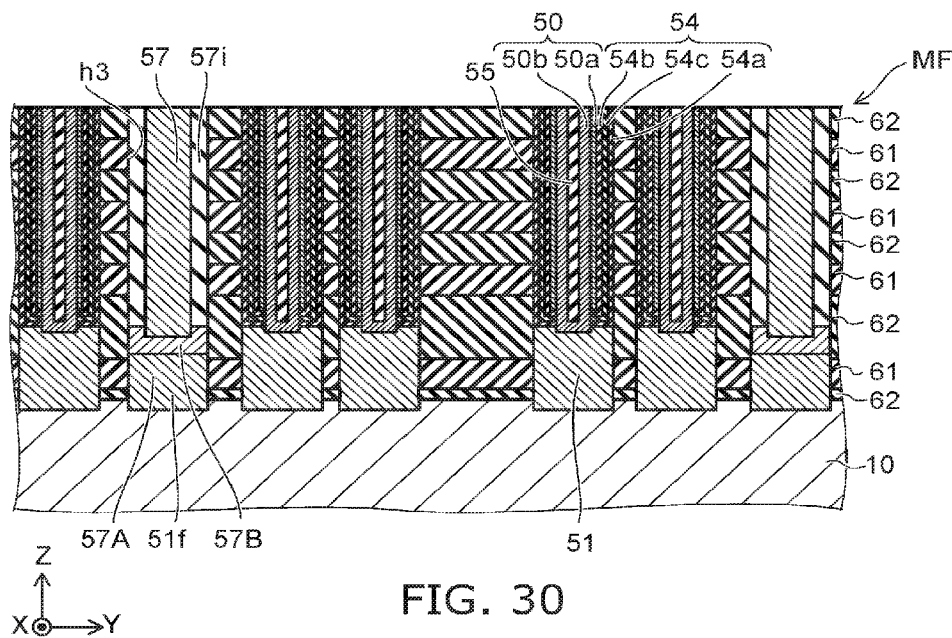
FIG. 30 is schematic cross-sectional views in order of the processes, illustrating a method for manufacturing the other semiconductor memory device according to the second embodiment.

As shown in FIG. 30, after removing the amorphous silicon film 63A and the liner film 63L inside the holes h3 (the source line trenches), an impurity (e.g., As) is introduced to the surface of the semiconductor film 51f of the lower portion of the source line trenches by ion implantation. Thereby, the second intermediate semiconductor region 57B and the first intermediate semiconductor region 57A are formed. Further, inside the source line trenches, a sidewall insulating film (e.g., silicon oxide) is formed; the insulating film 57i is formed; further, a conductive material (e.g., a stacked film of Ti—TiN) is filled into the remaining space of the source line trenches. Thereby, the conductive portion 57 is formed.

Figure 31:
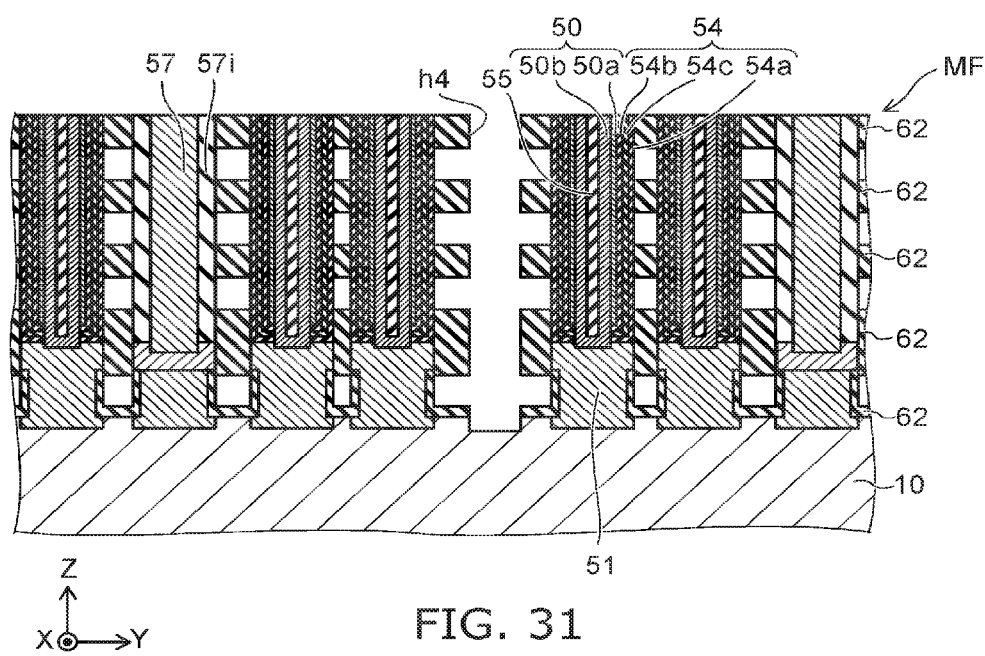
FIG. 31 is schematic cross-sectional views in order of the processes, illustrating a method for manufacturing the other semiconductor memory device according to the second embodiment.

As shown in FIG. 31, a hole h4 (e.g., a selection transistor dividing trench) is formed in the stacked film MF between the multiple semiconductor bodies 50; and the first films 61 are removed via the hole h4.

Figure 32:
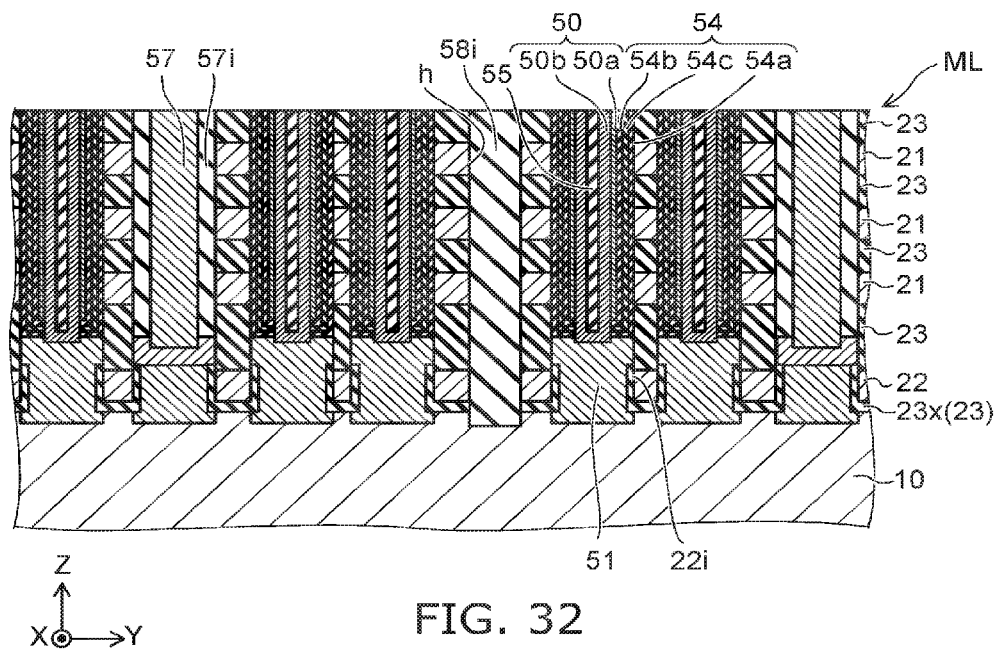
FIG. 32 is schematic cross-sectional views in order of the processes, illustrating a method for manufacturing the other semiconductor memory device according to the second embodiment.

As shown in FIG. 32, a high dielectric constant film (e.g., an aluminum oxide film), a barrier metal film (e.g., TiN), and a conductive material (e.g., tungsten) are filled into the space formed where the first films 61 are removed; and isotropic etch-back is performed. The conductive layers 21 are formed of the conductive material. In other words, replacing is performed. Further, the insulating portion 58i is formed by filling an insulating material (e.g., silicon oxide) into the hole h4. Subsequently, the semiconductor memory device 121 is formed by the prescribed processes.

In the example of the method for manufacturing the semiconductor memory device 122 as well, for example, common epitaxial growth of the semiconductor film is performed once for the memory holes and the source line trenches. Thereby, for example, a decrease of the process cost is possible; and, for example, a semiconductor memory device that has a lower cost is obtained. The load of the heating process for the epitaxial growth decreases; and, for example, the degradation of the transistor characteristics of the peripheral circuit portion is suppressed. A high-performance semiconductor memory device is obtained.

In the example of the method for manufacturing the semiconductor memory device 122, the gate electrode of the lower selection transistor also is formed by the replacement method. Thereby, the gate insulating film of the lower selection transistor can be formed by oxidizing a portion of the semiconductor film 51f (the silicon film) that is epitaxially grown. Thereby, for example, a high-quality gate oxide film is obtained. For example, the subthreshold characteristics of the selection transistor can be improved. For example, the fluctuation of the threshold of the selection transistor can be improved. For example, the reliability of the semiconductor memory device can be increased.

Figure 33:
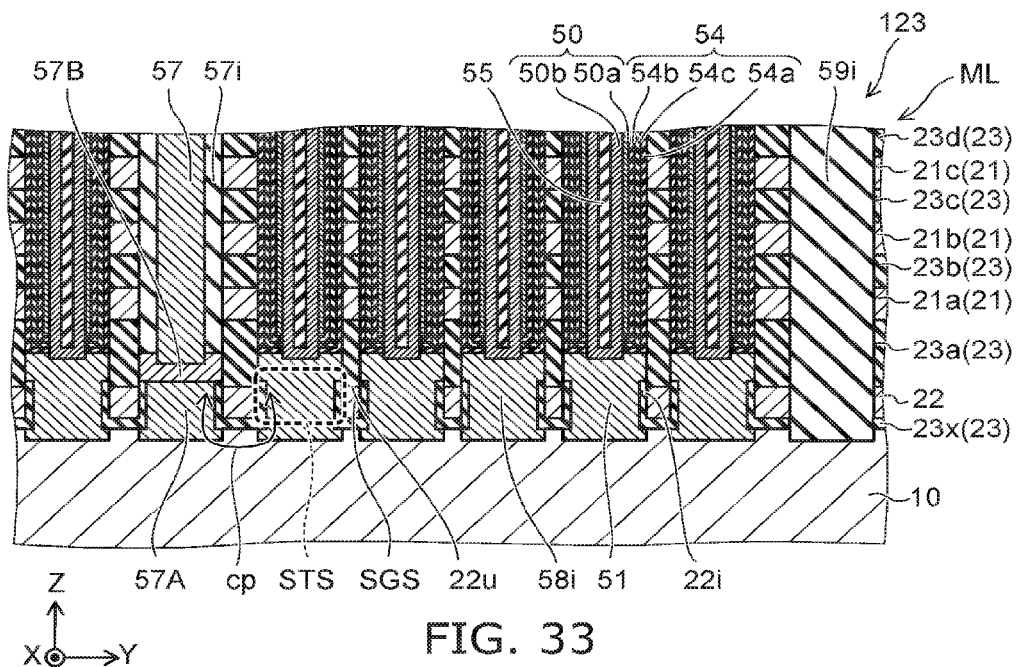
FIG. 33 is a schematic cross-sectional view illustrating another semiconductor memory device according to the second embodiment.

FIG. 33 is a schematic cross-sectional view illustrating another semiconductor memory device according to the second embodiment.

In the semiconductor memory device 123 shown in FIG. 33, for example, an insulating portion 59i is provided inside the stacked body ML. For example, the insulating portion 59i spreads along the Z-X plane. At least a portion of the insulating portion 59i overlaps at least a portion of the semiconductor body 50 in the Y-axis direction. Otherwise, the semiconductor memory device 123 is similar to the semiconductor memory device 120 or 122; and a description is therefore omitted.

In the semiconductor memory device 123 as well, the degradation of the short-channel effect of the lower selection transistor can be suppressed. For example, the $n^+$-impurity diffusion into the memory hole lower portion is deterred. For example, the erase operation stabilizes. For example, the decrease of the erasing voltage becomes easy. High reliability is obtained. A high yield is obtained.

An example of the method for manufacturing the semiconductor memory device 123 will now be described. In the following description, a description is omitted as appropriate for portions similar to the description recited above for the method for manufacturing the semiconductor memory device 120, 121, or 122.

FIG. 34 to FIG. 40 are schematic cross-sectional views in order of the processes, illustrating the method for manufacturing the other semiconductor memory device according to the second embodiment.

Figure 34:
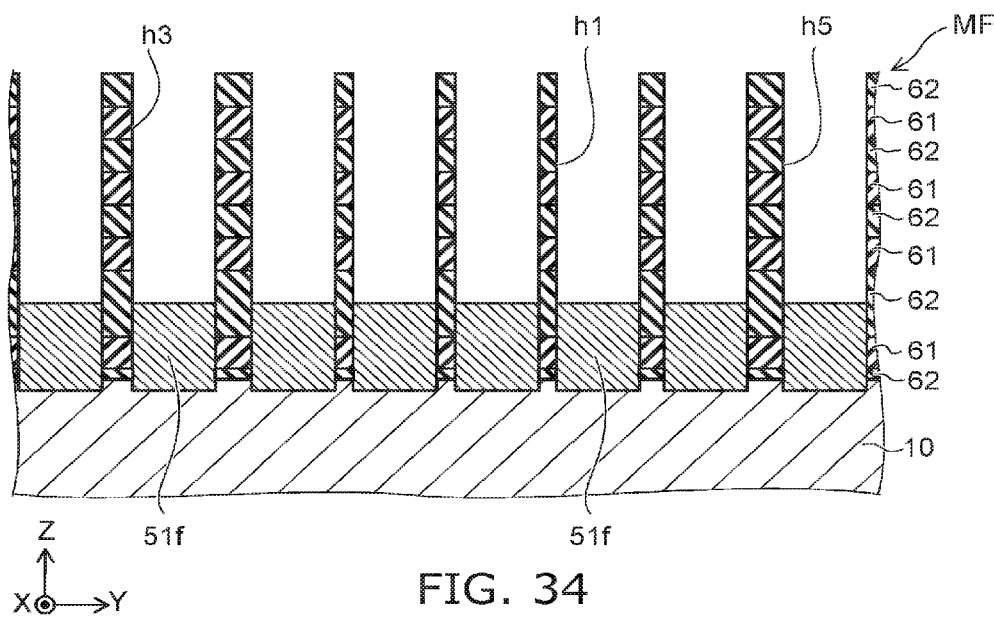
FIG. 34 is schematic cross-sectional views in order of the processes, illustrating a method for manufacturing the other semiconductor memory device according to the second embodiment.

As shown in FIG. 34, the stacked film MF is formed on the base semiconductor layer 10; and the holes h1 (e.g., the memory holes), the hole h3 (the source line trench), and a hole h5 (a dividing trench) are formed in the stacked film MF. The second films 62 (e.g., silicon oxide) and the first films 61 (e.g., silicon nitride) are formed alternately as the stacked film MF. Further, for example, selective epitaxial growth of the semiconductor film 51f (e.g., the silicon film) is performed at the lower portions of the memory holes and the source line trench. For example, the multiple holes h3 that are arranged in the Y-axis direction may be provided; and a portion of the multiple holes h3 may be considered to be the hole h5.

Figure 35:
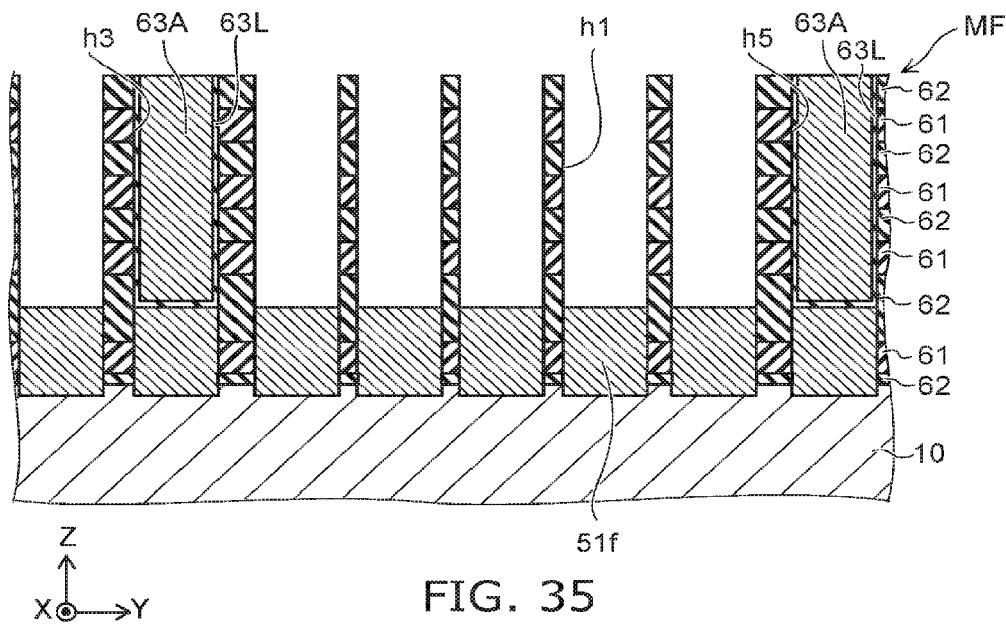
FIG. 35 is schematic cross-sectional views in order of the processes, illustrating a method for manufacturing the other semiconductor memory device according to the second embodiment.

As shown in FIG. 35, the liner film 63L (e.g., silicon oxide) and the amorphous silicon film 63A are formed; and after performing etch-back of the upper portion, these films of the interiors of the holes h1 (the memory holes) are removed by lithography and wet etching.

Figure 36:
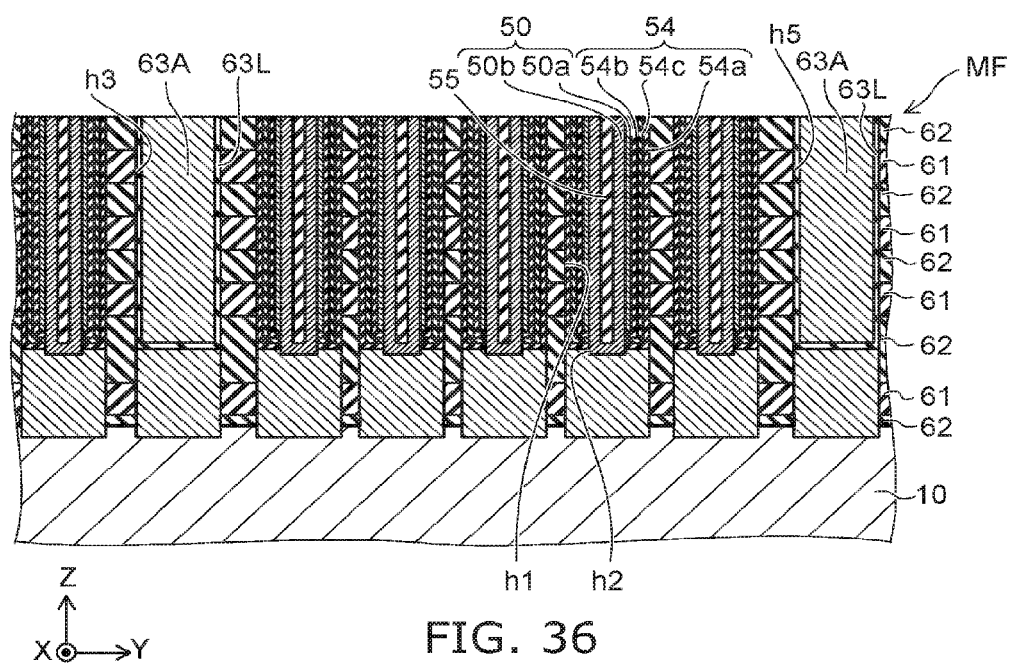
FIG. 36 is schematic cross-sectional views in order of the processes, illustrating a method for manufacturing the other semiconductor memory device according to the second embodiment.

As shown in FIG. 36, the memory layer 54, the semiconductor body 50, and the core insulating layer 55 are formed in the interiors of the holes h1 (the memory holes). For example, the method described in reference to the semiconductor memory device 120 is used.

Figure 37:
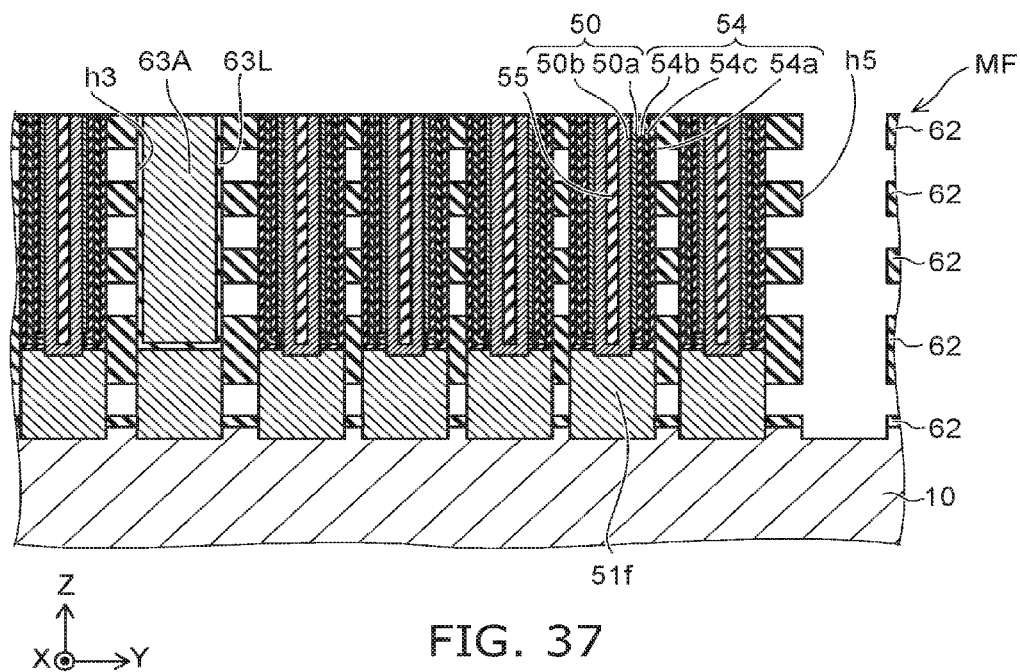
FIG. 37 is schematic cross-sectional views in order of the processes, illustrating a method for manufacturing the other semiconductor memory device according to the second embodiment.

As shown in FIG. 37, after removing the amorphous silicon film 63A and the liner film 63L inside the hole h5 (the dividing trench), the semiconductor film 51f (e.g., the epitaxial silicon film) at the lower portion of the hole h5 is removed by alkaline wet etching. Further, the first films 61 are removed.

Figure 38:
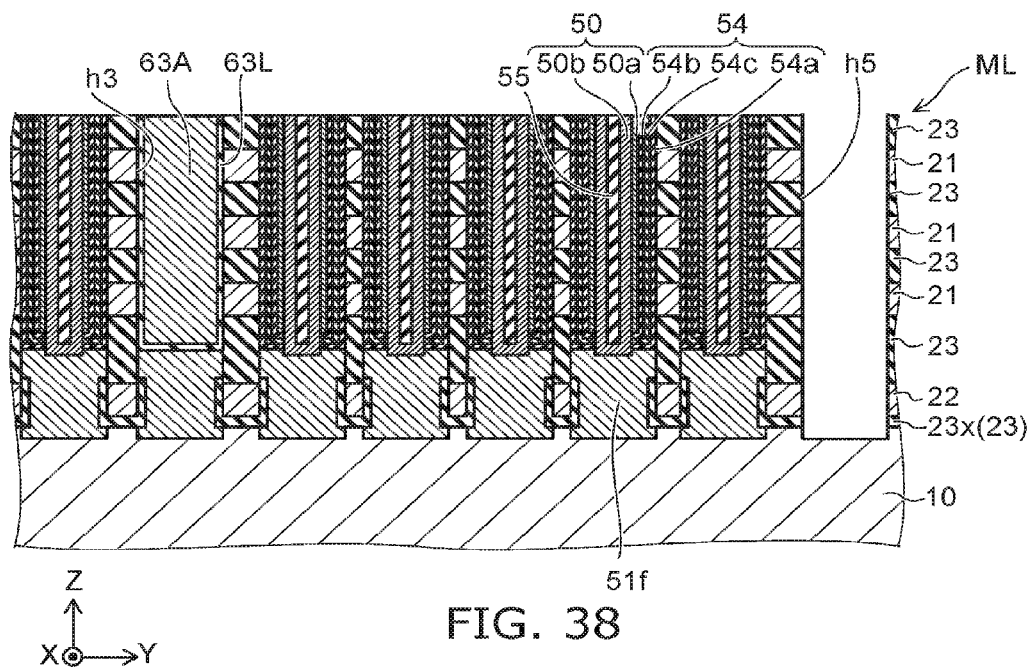
FIG. 38 is schematic cross-sectional views in order of the processes, illustrating a method for manufacturing the other semiconductor memory device according to the second embodiment.

As shown in FIG. 38, a high dielectric constant film (e.g., an aluminum oxide film), a barrier metal film (e.g., TiN), and a conductive material (e.g., tungsten) are filled into the space formed where the first films 61 are removed; and isotropic etch-back is performed. The conductive layers 21 are formed of the conductive material. In other words, replacing is performed.

Figure 39:
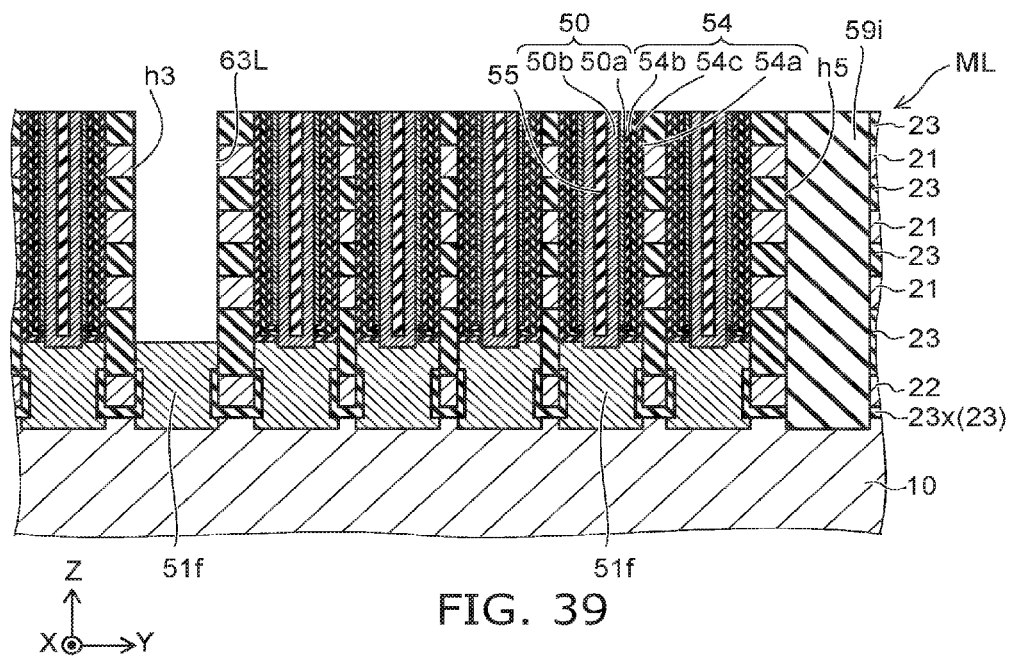
FIG. 39 is schematic cross-sectional views in order of the processes, illustrating a method for manufacturing the other semiconductor memory device according to the second embodiment.

As shown in FIG. 39, the insulating portion 59i is formed by filling an insulating material (e.g., silicon oxide) into the hole h5. Further, the amorphous silicon film 63A and the liner film 63L that are inside the hole h3 are removed.

Figure 40:
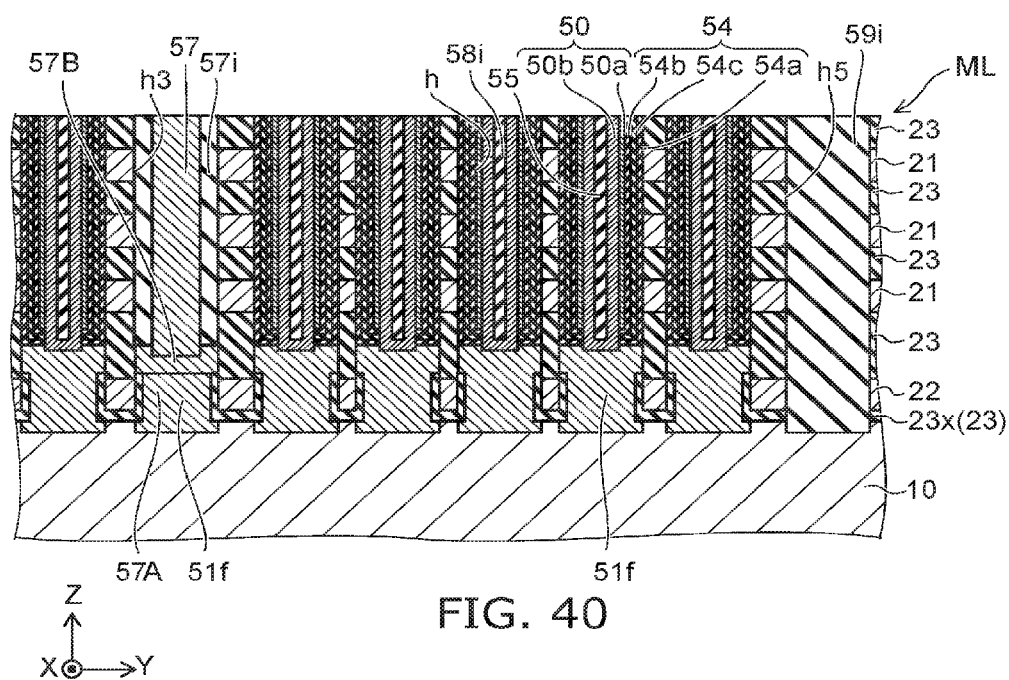
FIG. 40 is schematic cross-sectional views in order of the processes, illustrating a method for manufacturing the other semiconductor memory device according to the second embodiment.

As shown in FIG. 40, an impurity (e.g., As) is introduced to the surface of the semiconductor film 51f of the lower portion of the hole h3 (the source line trench) by ion implantation. Thereby, the second intermediate semiconductor region 57B and the first intermediate semiconductor region 57A are formed. Further, inside the source line trench, a sidewall insulating film (e.g., silicon oxide) is formed; the insulating film 57i is formed; further, a conductive material (e.g., a stacked film of Ti—TiN) is filled into the remaining space of the source line trench. Thereby, the conductive portion 57 is formed. Subsequently, the semiconductor memory device 121 is formed by the prescribed processes.

In the example of the method for manufacturing the semiconductor memory device 123 as well, for example, common epitaxial growth of the semiconductor film is performed once for the memory holes and the source line trenches. Thereby, for example, a decrease of the process cost is possible; and, for example, a semiconductor memory device that has a lower cost is obtained. The load of the heating process for the epitaxial growth decreases; and, for example, the degradation of the transistor characteristics of the peripheral circuit portion is suppressed. A high-performance semiconductor memory device is obtained.

In the example of the method for manufacturing the semiconductor memory device 123 as well, the gate electrode of the lower selection transistor is formed by a replacement method. Thereby, the gate insulating film of the lower selection transistor can be formed by oxidizing the semiconductor film 51f (the silicon film) that is epitaxially grown. Thereby, for example, a high-quality gate oxide film is obtained. For example, the subthreshold characteristics of the selection transistor can be improved. For example, the fluctuation of the threshold of the selection transistor can be improved. For example, the reliability of the semiconductor memory device can be increased.

In the example of the method for manufacturing the semiconductor memory device 123, compared to the example of the method for manufacturing the semiconductor memory device 122, the SG dividing trench becoming deeper can be suppressed. The SG dividing trench is provided to divide the gate electrode of the upper selection transistor. On the other hand, it is also possible to set a common potential for the lower selection transistors by block unit. In the example of the semiconductor memory device 123, it is possible to divide the application of the collectively-made source line trenches into two types of applications using rough lithography without performing deep trench etching of the SG dividing trench. Thereby, for example, the addition of deep trench etching can be omitted. For example, the process cost can be reduced.

In the semiconductor memory device 123, the multiple word line separation trenches (the holes h3, the holes h5, etc.) that are provided periodically are provided between the multiple memory hole arrays (the multiple semiconductor bodies 50). Then, an impurity diffusion layer (e.g., the second intermediate semiconductor region 57B) is provided at the lower portion of some (e.g., one half or less) of the multiple word line separation trenches. Further, a conductive material is filled into the interior of the word line separation trenches; and the interconnects (e.g., the source lines SL) that are provided on the stacked body ML and the conductive member (e.g., the base semiconductor layer 10) that is provided under the stacked body ML are electrically connected.

Figure 41:
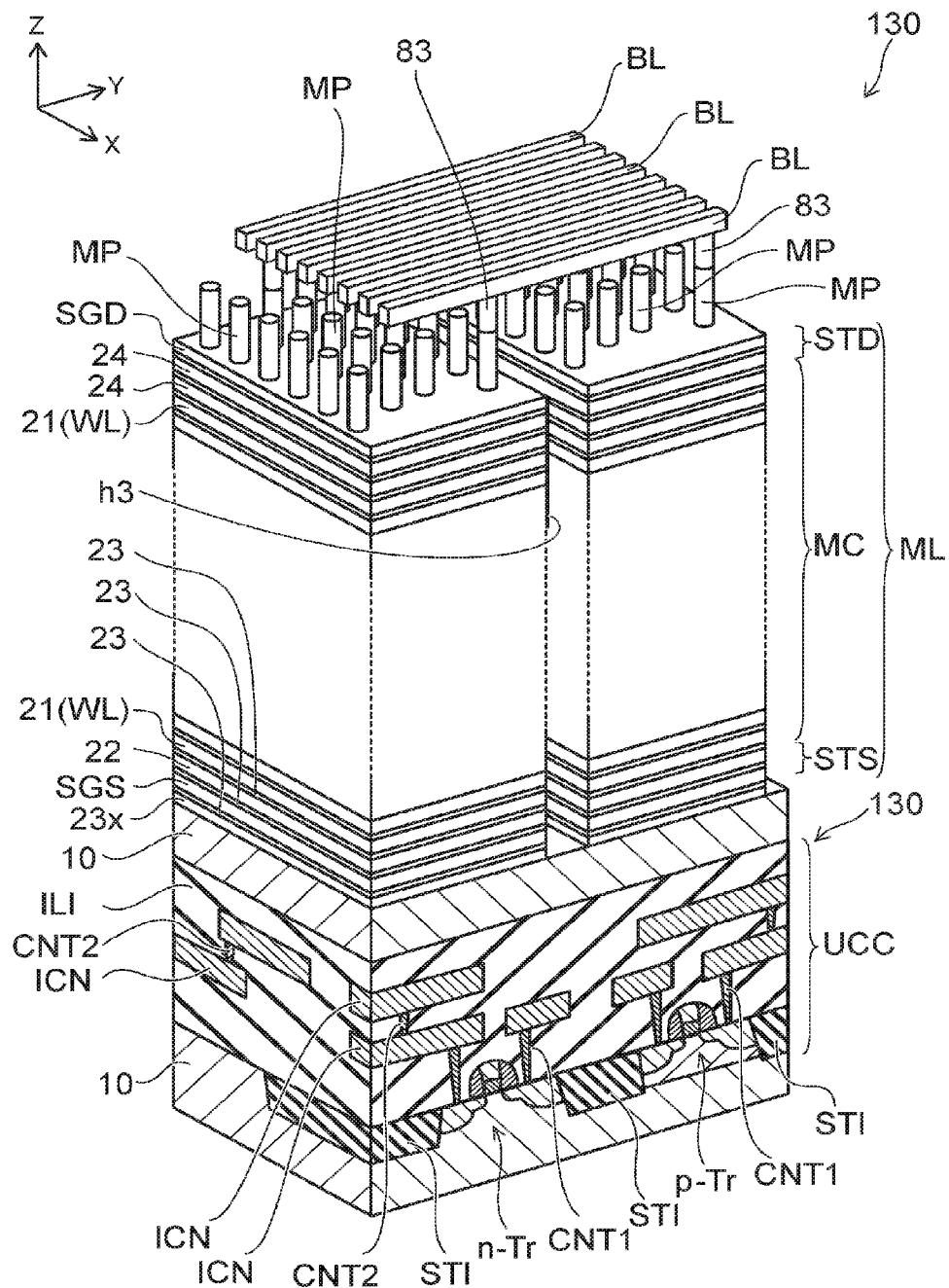
FIG. 41 is a schematic perspective view illustrating the semiconductor memory device according to the embodiment.

FIG. 41 is a schematic perspective view illustrating the semiconductor memory device according to the embodiment.

In the semiconductor memory device 130 as shown in FIG. 41, the base semiconductor layer 10 is provided in the upper portion of a silicon substrate 10s; and the stacked body ML is provided on the base semiconductor layer 10. The source-side selection transistor STS is provided in the lower portion of the stacked body ML; and a drain-side selection transistor STD is provided in the upper portion. Multiple memory bodies MP extend through the stacked body ML. The memory bodies MP include the memory layer 54 and the semiconductor body 50. In the drawing, the hole h3 (the trench) is provided between two stacked bodies ML; and the conductive portion 57 recited above (not illustrated in FIG. 41) is provided in the hole h3. The source line SL is not illustrated in the drawing.

In the silicon substrate 10s, the base semiconductor layer 10 is provided on an inter-layer insulating film ILI. The inter-layer insulating film ILI includes, for example, silicon oxide. An under-cell circuit UCC (e.g., a peripheral circuit) is provided in the silicon substrate 10s. The under-cell circuit UCC includes a drive circuit. For example, the drive circuit performs the programming, reading, and erasing of the data to and from the transistors of the memory cells MC. For example, the under-cell circuit UCC includes a sense amplifier.

For example, the silicon substrate 10s is subdivided into multiple active areas by an insulating portion STI (Shallow Trench Isolation). In one active area, an n-type transistor n-Tr (a MOSFET (Metal-Oxide-Semiconductor Field-Effect Transistor)) is provided. In one other active area, a p-type transistor p-Tr (a MOSFET) is provided. Multiple interconnects ICN are provided in multilayers inside the inter-layer insulating film ILI. Further, connection members CNT1 that connect the multiple interconnects ICN to the silicon substrate 10s are provided; and connection members CNT2 that connect the multiple interconnects ICN to each other are provided.

In the semiconductor memory device 130, because the under-cell circuit UCC (e.g., the peripheral circuit) is provided in the portion under the memory cells MC, the surface area of the semiconductor memory device 130 can be reduced. In the semiconductor memory device 130, any configuration described in reference to the first embodiment or the second embodiment or a modification of the configuration is applicable to the configuration of the memory region MR.

According to the embodiments, a semiconductor memory device can be provided in which stable operations are possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive layers, insulating layers, memory cells, semiconductor bodies, memory layers, semiconductor regions, conductive portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices, and methods for manufacturing the same practicable by an appropriate design modification by one skilled in the art based on the semiconductor memory devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor memory device, comprising:
a base semiconductor layer;
a first conductive layer separated from the base semiconductor layer in a first direction;
a second conductive layer provided between the base semiconductor layer and the first conductive layer;
a semiconductor body extending through the first conductive layer in the first direction;
a memory layer provided between the semiconductor body and the first conductive layer;
a first semiconductor region provided between the memory layer and the base semiconductor layer and between the semiconductor body and the base semiconductor layer, the first semiconductor region being of a first conductivity type;
a second semiconductor region provided between the first semiconductor region and the memory layer, the second semiconductor region being of a second conductivity type; and
an insulating portion provided between the first semiconductor region and the second conductive layer.

2. The semiconductor memory device according to claim 1, wherein the semiconductor body contacts the first semiconductor region and contacts the second semiconductor region.

3. The semiconductor memory device according to claim 1, wherein
the semiconductor body has a side surface crossing a second direction perpendicular to the first direction,
a portion of the side surface contacts the first semiconductor region, and
another portion of the side surface contacts the second semiconductor region.

4. The semiconductor memory device according to claim 1, wherein the semiconductor body is electrically connected to the first semiconductor region and the second semiconductor region.

5. The semiconductor memory device according to claim 1, wherein
the second conductive layer is provided on the base semiconductor layer,
the first conductive layer is provided on the second conductive layer, and
a lower end portion of the semiconductor body is positioned lower than an upper end portion of the first semiconductor region.

6. The semiconductor memory device according to claim 1, wherein
the second conductive layer is provided on the base semiconductor layer,
the first conductive layer is provided on the second conductive layer, and
at least a portion of the second semiconductor region is positioned higher than an upper end portion of the second conductive layer.

7. The semiconductor memory device according to claim 1, wherein
the second conductive layer is provided on the base semiconductor layer,
the first conductive layer is provided on the second conductive layer, and
a lower end portion of the first semiconductor region is positioned lower than an upper end portion of the base semiconductor layer.

8. The semiconductor memory device according to claim 1, wherein
the memory layer includes:
a memory film;
a first insulating film including a portion provided between the memory film and the first conductive layer; and
a second insulating film provided between the memory film and the semiconductor body.

9. The semiconductor memory device according to claim 8, wherein the first insulating film further includes a portion provided between the memory film and the second semiconductor region.

10. The semiconductor memory device according to claim 1, further comprising:
- a conductive portion extending in the first direction and being separated from the semiconductor body along a second direction perpendicular to the first direction; and
- an intermediate semiconductor region provided between the base semiconductor and the conductive portion and electrically connected to the base semiconductor layer and the conductive portion,
- a concentration of an impurity of at least a portion of the intermediate semiconductor region being higher than a concentration of the impurity of the base semiconductor layer.

11. The semiconductor memory device according to claim 10, wherein the at least a portion of the intermediate semiconductor region is of the second conductivity type.

* * * * *